(12) United States Patent
Kiyokawa et al.

(10) Patent No.: US 9,588,142 B2
(45) Date of Patent: Mar. 7, 2017

(54) ELECTRONIC DEVICE HANDLING APPARATUS AND ELECTRONIC DEVICE TESTING APPARATUS

(71) Applicant: ADVANTEST CORPORATION, Tokyo (JP)

(72) Inventors: Toshiyuki Kiyokawa, Tokyo (JP); Koya Karino, Tokyo (JP); Daisuke Takano, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/523,009

(22) Filed: Oct. 24, 2014

(65) Prior Publication Data
US 2016/0116503 A1  Apr. 28, 2016

(51) Int. Cl.
*G01R 1/067* (2006.01)
*G01R 1/073* (2006.01)
*G01R 31/26* (2014.01)

(52) U.S. Cl.
CPC ..... *G01R 1/06794* (2013.01); *G01R 1/07342* (2013.01); *G01R 31/2601* (2013.01)

(58) Field of Classification Search
CPC ............ G01R 31/2887; G01R 31/2886; G01R 31/2893; G01R 31/2851; Y10T 29/49004; Y10T 29/53174; H01R 13/6315
USPC ....................................................... 324/750
See application file for complete search history.

(56) References Cited

U.S. PATENT DOCUMENTS

| 5,321,352 A * | 6/1994 | Takebuchi | G01R 31/2887 324/690 |
| 5,749,698 A * | 5/1998 | Miyoshi | G01R 1/07307 198/836.3 |
| 8,587,331 B2 * | 11/2013 | Berry | G01R 31/2891 324/750.16 |

(Continued)

FOREIGN PATENT DOCUMENTS

| JP | 02-224930 A | 9/1990 |
| JP | 2002-131374 A | 5/2002 |

(Continued)

OTHER PUBLICATIONS

Office Action issued in Taiwan family member Patent Appl. No. 104116188, dated Jun. 8, 2016, along with an English translation thereof.

(Continued)

*Primary Examiner* — Son Le
*Assistant Examiner* — Akm Zakaria
(74) *Attorney, Agent, or Firm* — Greenblum & Bernstein, P.L.C.

(57) ABSTRACT

Provided is an electronic device handling apparatus capable of increasing the number of simultaneous measurements while suppressing the increase in cost. An electronic device handling apparatus, which moves bare dies relative to a probe card, includes: a thermal head which includes a plurality of holding regions each of which holds the bare die and has openings; at least one lift unit which is movably held by the thermal head so as to correspond to the holding regions and is able to advance and retreat through the openings; a moving device which moves the thermal head; and a fixed arm which is able to support the one lift unit.

6 Claims, 19 Drawing Sheets

(56) References Cited

U.S. PATENT DOCUMENTS

| | | | | |
|---|---|---|---|---|
| 2003/0222636 A1* | 12/2003 | Fujishiro | ............ | G01R 31/2893 324/750.21 |
| 2005/0022376 A1* | 2/2005 | Alcoe | .................. | G01R 1/0483 29/837 |
| 2005/0184741 A1* | 8/2005 | Sun | .................... | G01R 31/2886 324/754.07 |
| 2006/0290369 A1* | 12/2006 | Yamashita | ......... | G01R 31/2886 324/750.2 |
| 2013/0181735 A1 | 7/2013 | Horino et al. | | |
| 2014/0111235 A1 | 4/2014 | Kikuchi | | |

FOREIGN PATENT DOCUMENTS

| | | |
|---|---|---|
| JP | 2006-317346 A | 11/2006 |
| JP | 2013-145134 A | 7/2013 |
| KR | 10-2014-0052828 A | 5/2014 |
| TW | 200925620 A | 6/2009 |
| TW | 200945464 A | 11/2009 |
| TW | 201133677 A | 10/2011 |
| TW | 201331599 A | 8/2013 |
| WO | 2004/106944 A1 | 12/2004 |

OTHER PUBLICATIONS

Office Action issued in Korean Counterpart Patent Appl. No. 10-2015-0080411, dated Aug. 8, 2016, along with an English-language translation thereof.

\* cited by examiner

ELECTRONIC DEVICE HANDLING APPARATUS AND ELECTRONIC DEVICE TESTING APPARATUS

TECHNICAL FIELD

The present invention relates to an electronic device handling apparatus for handling an electronic device under test (DUT: Device Under Test) and an electronic device testing apparatus for testing an electronic device.

BACKGROUND ART

An apparatus for testing a divided one-chip semiconductor device obtained by dicing a wafer is known (refer to, for example, Patent Document 1). The apparatus includes a chuck stage which is movable in three axial directions and rotatable about the z axis. In the test apparatus, before bringing the semiconductor device into contact with a probe, positioning of the semiconductor device with respect to the probe is performed by using the chuck stage.

CITATION LIST

Patent Document

Patent Document 1: JP 2006-317346 A

SUMMARY OF THE INVENTION

Problem to be Solved by the Invention

The throughput of the test apparatus can be improved by simultaneously testing a plurality of DUTs (by increasing so-called the number of simultaneous measurements). In the above-described test apparatus, a plurality of chuck stages are installed so as to increase the number of simultaneous measurements. However, in this case, the number of actuators for driving the chuck stages are greatly increased, and as a result, there is a problem in that cost of the electronic device testing apparatus is increased.

The present invention is to provide an electronic device handling apparatus capable of increasing the number of simultaneous measurements while suppressing the increase in cost and an electronic device testing apparatus including the electronic device handling apparatus.

Means for Solving Problem

[1] An electronic device handling apparatus according to the present invention is an electronic device handling apparatus which moves electronic devices under test relative to a contact unit, comprising: a holding member which includes holding regions each of which holds the electronic device under test and has openings; at least one position adjusting member which is movably held by the holding member so as to correspond to the holding regions and is able to advance and retreat through the openings; a first moving unit which moves the holding member; and a supporting member which is able to support the one position adjusting member.

[2] In the above invention, the supporting member may come into contact with the one position adjusting member to support the position adjusting member according to a moving operation of the holding member by using the first moving unit.

[3] In the above invention, the electronic device handling apparatus may comprise a control unit which controls the first moving unit, and the control unit may control the first moving unit so that the first moving unit moves the holding member in the state where the supporting member supports the position adjusting member.

[4] In the above invention, the electronic device handling apparatus may comprise a position detection unit which detects a relative position of the electronic device under test relative to the contact unit, and the control unit may control the first moving unit on the basis of the relative position detected by the position detection unit.

[5] In the above invention, the first moving unit and the supporting member may be fixed relative to the same base member.

[6] In the above invention, the position adjusting member may include: at least one pin which is able to protrude from the holding region through the opening; and a block on which the pin is standingly provided, and the holding member may include: through-holes which communicate with the openings and into which the pins are inserted; and a receiving space which communicates with the through-holes and which receives the block.

[7] In the above invention, the receiving space may include a window portion, and the supporting member may include: a first arm portion which is standingly provided on the base member; and a second arm portion which is supported by the first arm portion and is able to enter the receiving space through the window portion to support the block.

[8] In the above invention, the through-holes may extend in a first direction, the window portion may be open from the receiving space toward a second direction which is substantially perpendicular to the first direction, and the second arm portion may extend in a third direction which is substantially opposite to the second direction.

[9] In the above invention, the electronic device handling apparatus may comprise a second moving unit which moves the supporting member.

[10] In the above invention, the electronic device handling apparatus may comprise: a control unit which controls the second moving unit; and a position detection unit which detects a relative position of the electronic device under test relative to the contact unit, and the control unit may control the second moving unit on the basis of the relative position detected by the position detection unit,

[11] In the above invention, the position adjusting member may include: at least one pin which is able to protrude from the holding regions through the opening; and a block on which the pin is standingly provided, and the holding member may include: through-holes which communicate with the openings and into which the pins are inserted; and a receiving space which communicates with the through-holes and which receives the block.

[12] In the above invention, the receiving space may include a window portion, and the supporting member may be able to enter the receiving space through the window portion to support the block.

[13] In the above invention, the through-holes may extend in a first direction, the window portion may be open from the receiving space toward a second direction which is substantially perpendicular to the first direction, and the supporting member may extend in a third direction which is substantially opposite to the second direction.

[14] In the above invention, the electronic device under test may be a bare die, and the contact unit may be a probe card which includes contactors which comes into electrical contact with terminals of the bare die.

[15] An electronic device testing apparatus according to the present invention is an electronic device testing apparatus which tests electrical characteristics of electronic devices under test, comprising: the above described electronic device handling apparatus; and a test apparatus main body to which the contact unit is electrically connected.

Effect of the Invention

According to the present invention, it is possible to support a position adjusting member, which is movably held by a holding member, by using a supporting member. Therefore, in the state where the position adjusting member is supported by the supporting member, the supporting member is moved relative to the holding member, so that it is possible to individually perform positioning of a plurality of electronic devices under test which are held by the holding member, and it is possible to increase the number of simultaneous measurements while suppressing the increase in cost.

MODE(S) FOR CARRYING OUT THE INVENTION

Hereinafter, embodiments of the present invention will be described with reference to the drawings.

<First Embodiment>

Figure 1:
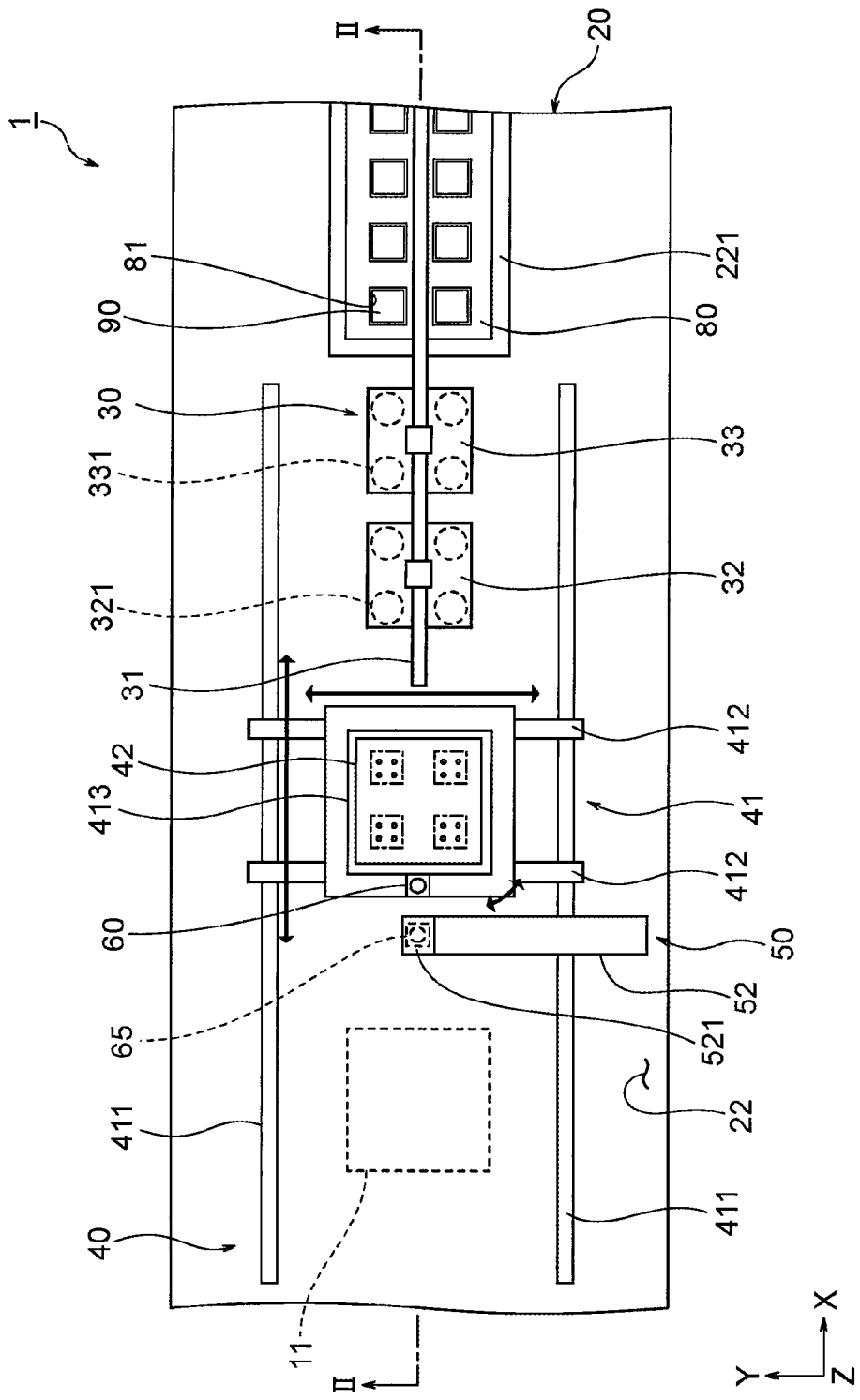
FIG. 1 is a plan diagram illustrating an internal structure of an electronic device testing apparatus in a first embodiment of the present invention.
Figure 2:
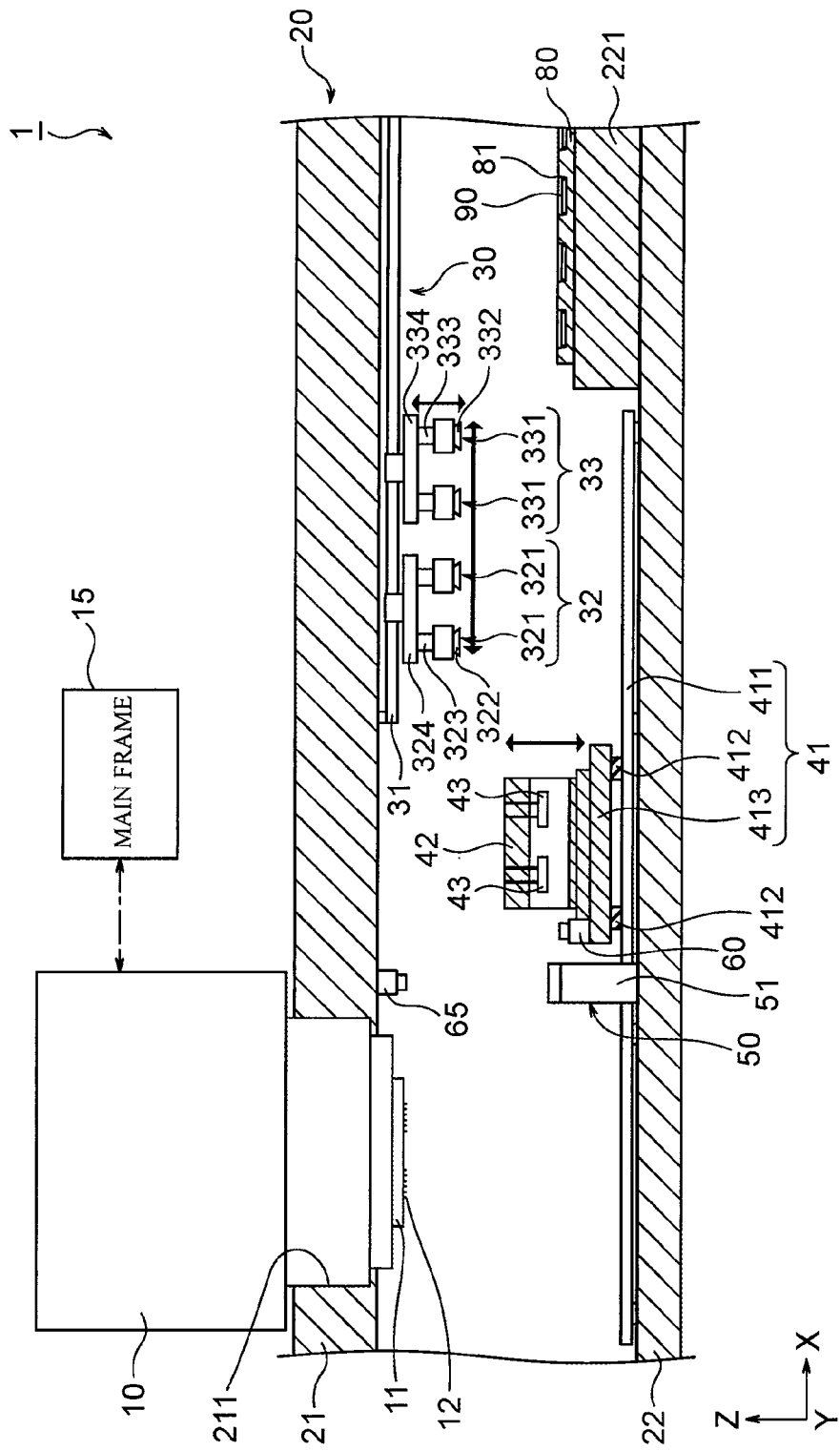
FIG. 2 is a cross-sectional diagram taken along line II-II of FIG. 1.
Figure 3:
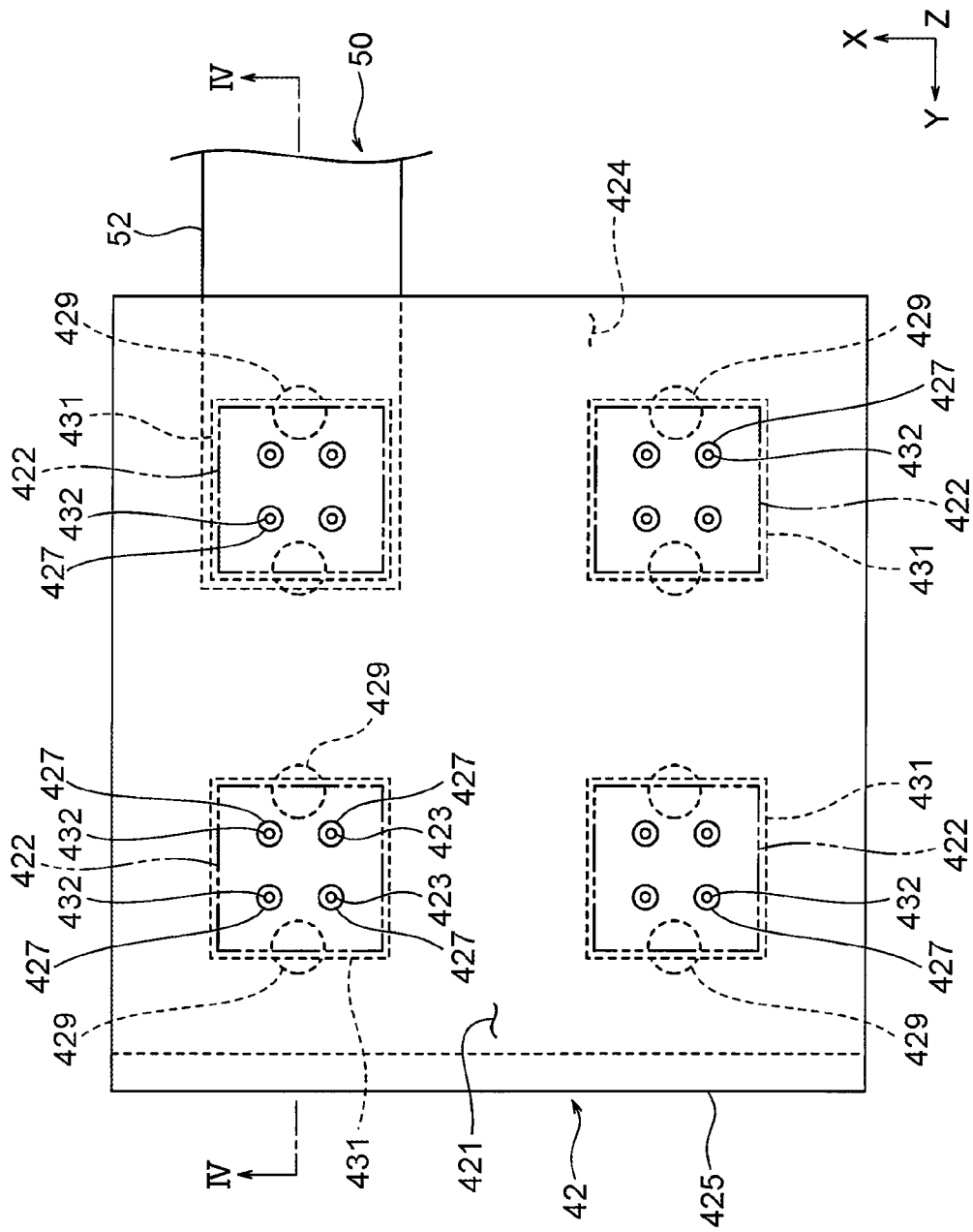
FIG. 3 is a plan diagram illustrating a thermal head of an alignment stage in the first embodiment of the present invention.
Figure 4:
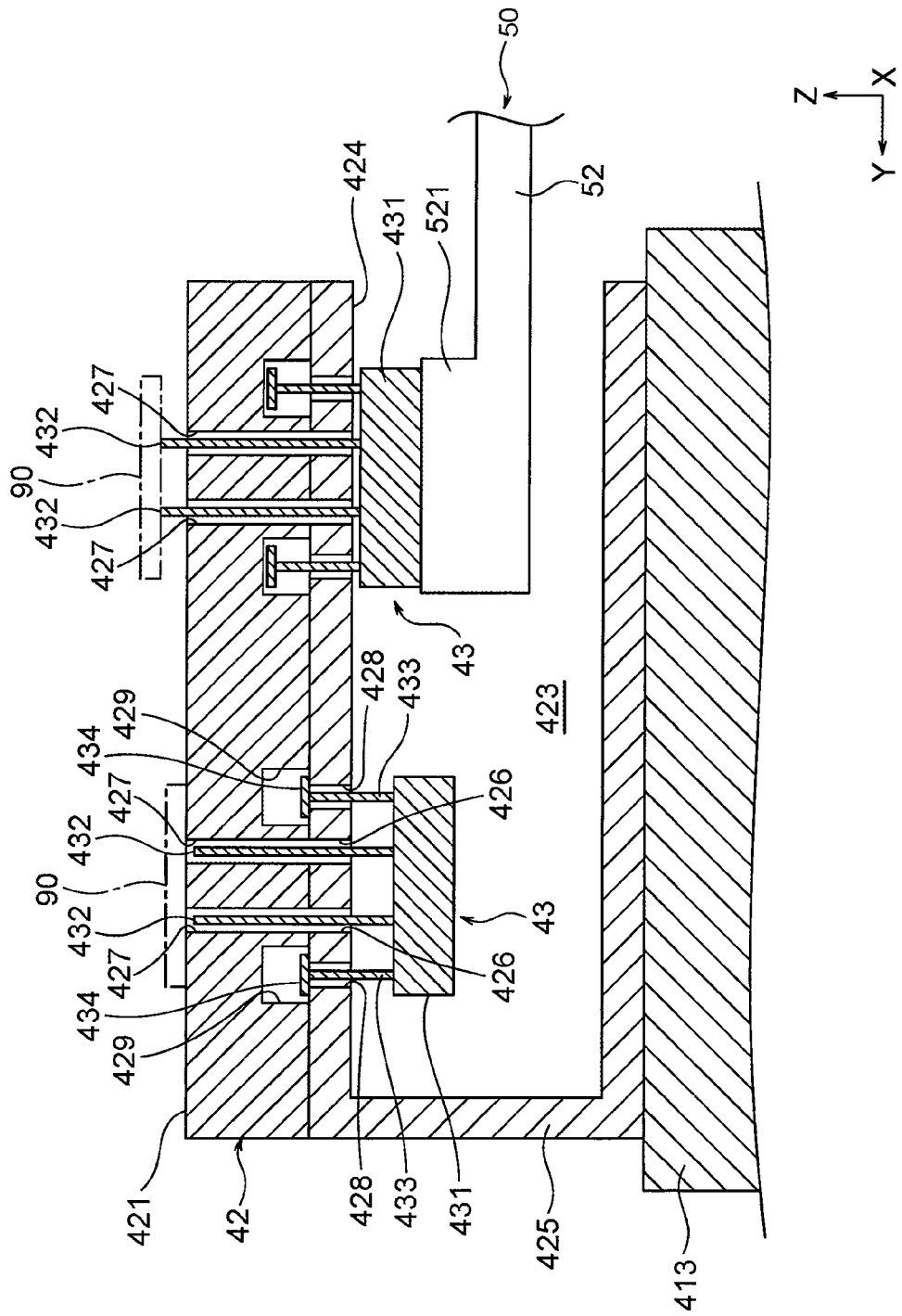
FIG. 4 is a cross-sectional diagram taken along line IV-IV of FIG. 3.
Figure 5:
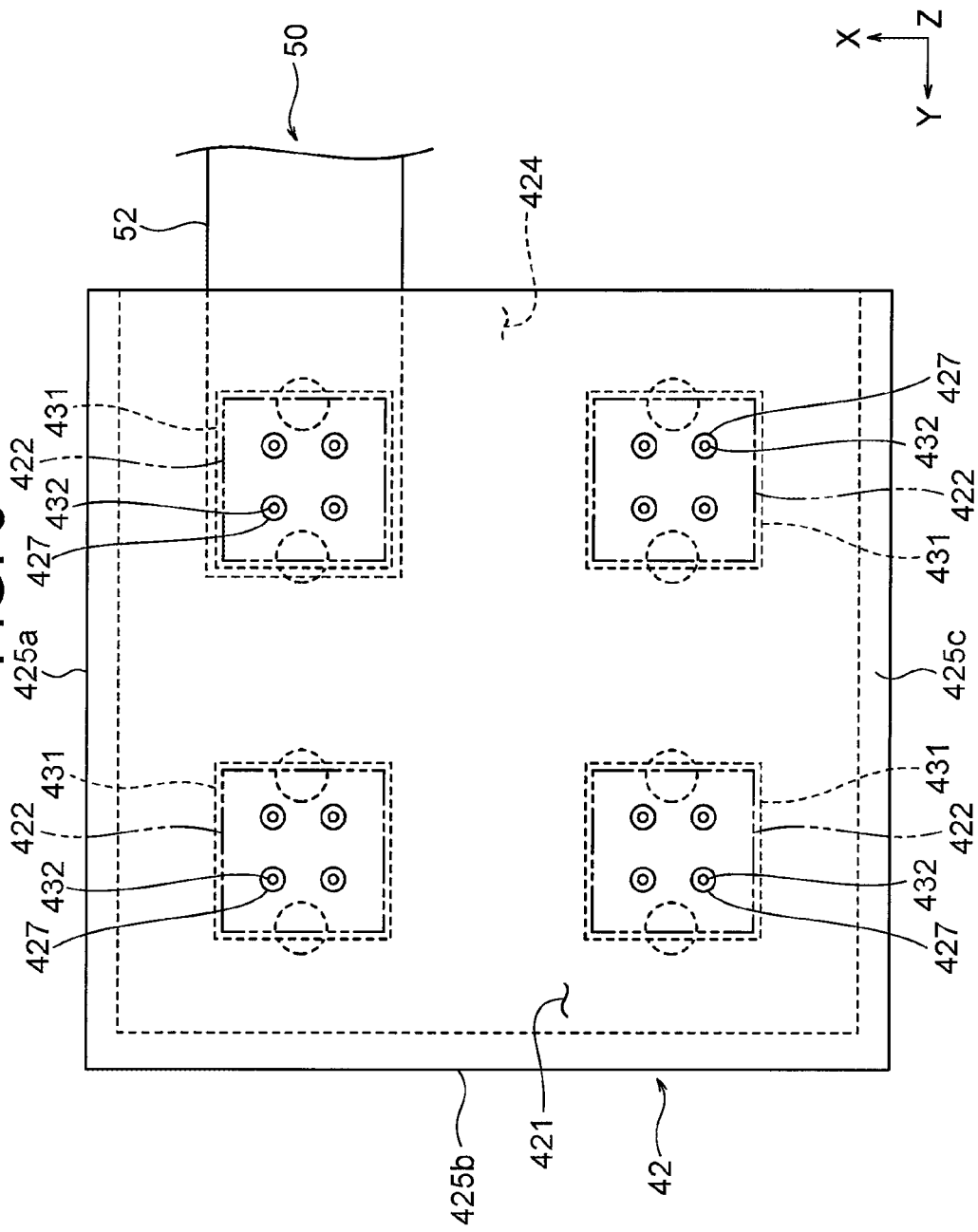
FIG. 5 is a plan diagram illustrating a modified example of the thermal head in the first embodiment of the present invention.
Figure 6:
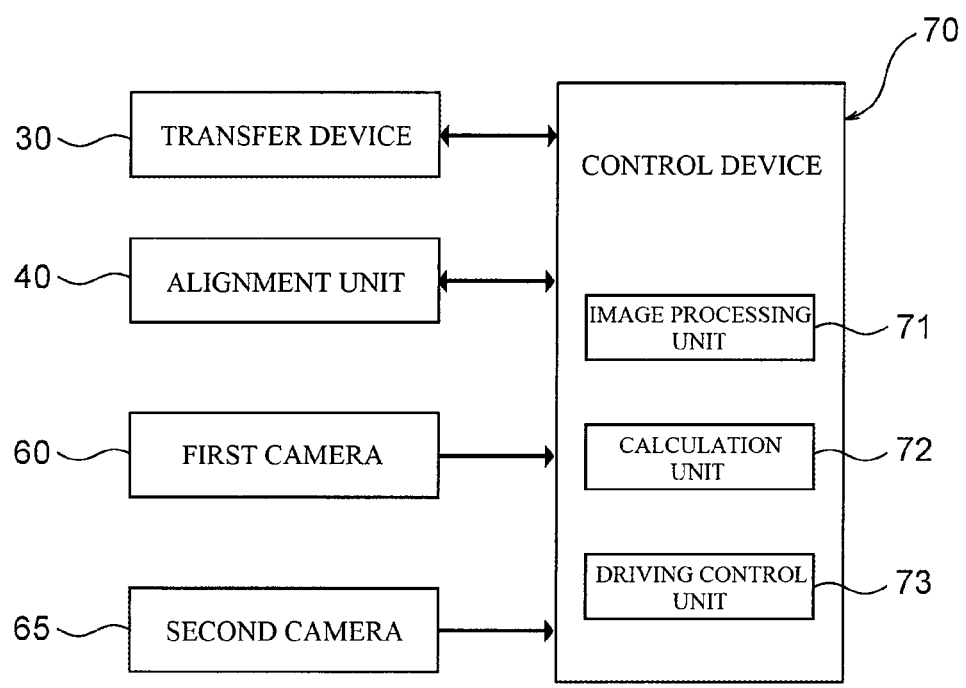
FIG. 6 is a block diagram illustrating a control system of an electronic device handling apparatus in the first embodiment of the present invention.

FIG. 1 is a plan diagram illustrating an internal structure of an electronic device testing apparatus in the embodiment, FIG. 2 is a cross-sectional diagram taken along line II-II of FIG. 1, FIG. 3 is a plan diagram illustrating a thermal head of an alignment stage in the embodiment, FIG. 4 is a cross-sectional diagram taken along line IV-IV of FIG. 3, FIG. 5 is a plan diagram illustrating a modified example of the thermal head, and FIG. 6 is a block diagram illustrating a control system of an electronic device handling apparatus in the embodiment.

The electronic device testing apparatus 1 in the embodiment is an apparatus for testing electrical characteristics of electronic circuits formed in bare dies (bare chips) after dicing a semiconductor wafer. As illustrated in FIGS. 1 and 2, the electronic device testing apparatus 1 includes: a test head 10 having a probe card 11; and a handler 20 for moving bare dies 90 to press against the probe card 11.

The probe card 11 is electrically connected to a test head 20 and faces the inside of the handler 20 through an opening 211 formed in an upper base 21 of the handler 20. The test head 10 is electrically connected to a main frame 15 through a cable.

Figure 10:
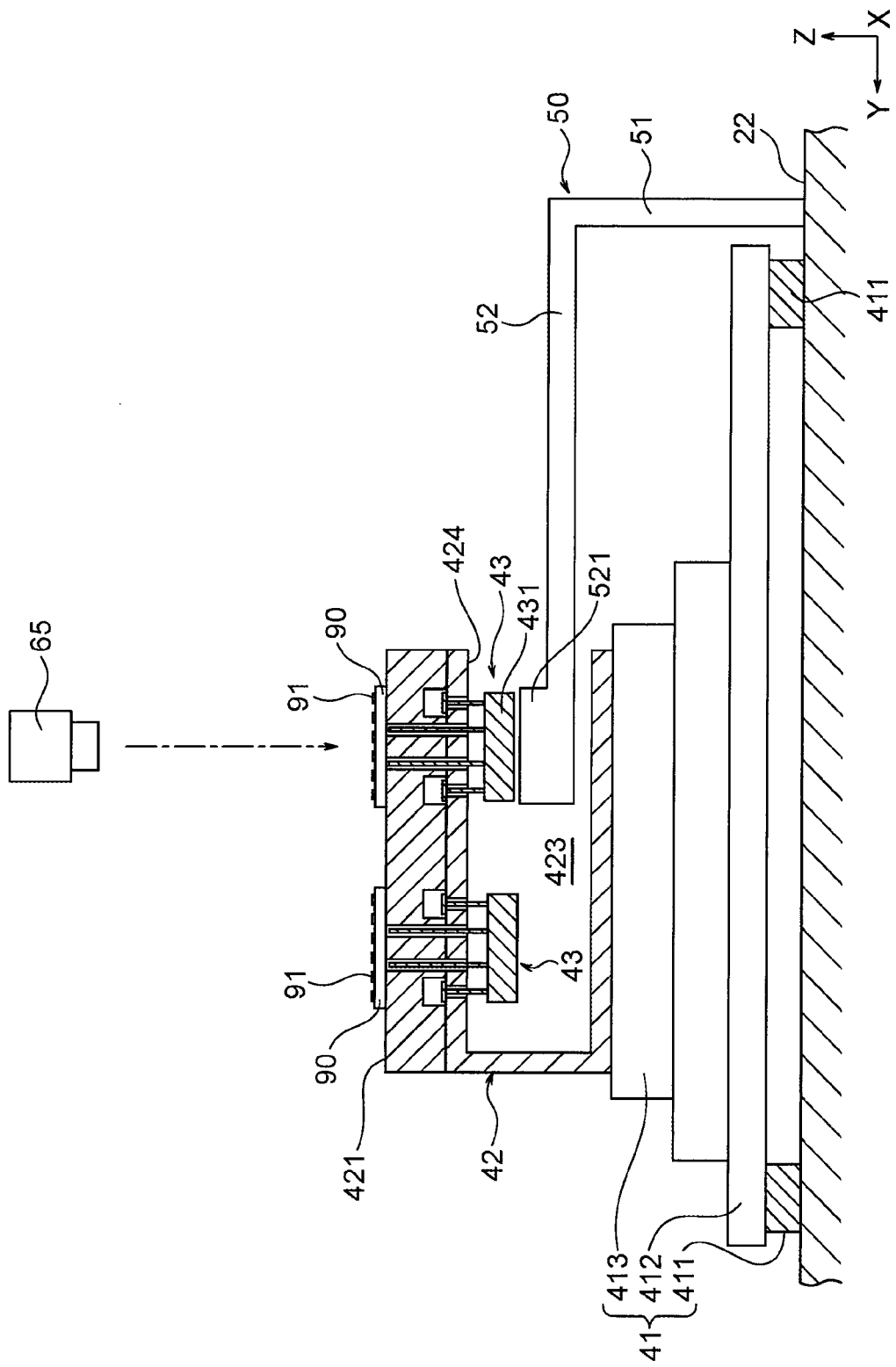
FIG. 10 is a cross-sectional diagram (No. 4) illustrating operations of the electronic device testing apparatus in the first embodiment of the present invention.

The probe card 11 includes a plurality of contactors 12 which are arranged so as to correspond to pads 91 of the bare dies 90 (refer to FIG. 10). As a specific example of the contactor 12, a cantilever type probe needle, a pogo pin, a hump formed on a membrane, a contactor manufactured by using a MEMS technique, or the like may be exemplified. In the embodiment, the contactors 12 are provided so as to correspond to the pads 91 of the four bare dies 90, so that it is possible to simultaneously test the four bare dies 90. The number of bare dies 90 which can be simultaneously tested is not particularly limited to the aforementioned number as long as the number is a plural number.

The test head 10 and the main frame 15 in the embodiment correspond to an example of a main body of a test apparatus in the present invention, and the handler 20 in the embodiment corresponds to an example of an electronic device handling apparatus in the present invention. The probe card 11 in the embodiment corresponds to a contact unit in the present invention. The bare die 90 in the embodiment corresponds to an example of an electronic device under test in the present invention, and the pad 91 of the bare die 90 in the embodiment corresponds to an example of a terminal of the electronic device under test in the present invention.

The handler 20 includes a transfer device 30, an alignment unit 40, and a fixed arm 50. In the embodiment, the transfer device 30 transfers the bare dies 90 from a tray 80 to an alignment unit 40. After the alignment unit 40 performs positioning of the bare dies 90, the alignment unit presses the bare dies 90 against the probe card 12 so as to bring into electrical contact with each other. In this state, the test head 10 and the main frame 15 performs test of electronic circuits formed in the bare dies 90. Next, when the test of the bare dies 90 is completed, the alignment unit 40 transports the tested bare dies 90 to the position near the transfer device 30, and the transfer device 30 transfers the bare dies 90 from the alignment unit 40 to the tray 80.

The transfer device 30 is a pick-and-place device which transfers untested or tested bare dies 90 between the tray 80 mounted on a tray mount unit 221 and the alignment unit 40 in the handler 20. The tray 80 includes concave-shaped containing portions 81 for containing the bare dies 90, and the containing portions 81 are arranged in a matrix. In the embodiment, the pitch of the containing portions 81 of the tray 80 is substantially equal to the pitch of holding regions 422 (described later) of a thermal head 42. In the present invention, the pitch of the containing portions 81 is not particularly limited to the aforementioned pitch, it may be different from the pitch of the holding regions 422.

As illustrated in FIGS. 1 and 2, the transfer device 30 includes an X directional rail 31 and two movable heads 32 and 33. The X directional rail 31 is held by the upper base 21 of the handler 20 and extends in the X direction. The first and second movable heads 32 and 33 are slidably held by the X directional rail 31 so as to move along the X direction. The transfer device 30 may also include a mechanism for moving the first and second movable heads 32 and 33 in the Y direction.

The first movable head 32 includes four first suction heads 321, and first suction nozzles 322 are attached to the lower ends of the respective first suction heads 321. The first suction head 321 is able to suction and hold the bare die 90 by using the first suction nozzle 322, so that the first movable head 32 is able to simultaneously hold the four bare dies 90. Each of the first suction heads 321 includes a first Z-driving unit 323 for lifting up and down the first suction nozzle 321.

The four first suction heads 321 are held by a first base portion 324. The four first suction heads 321 are held by the first base portion 324 with a pitch equal to that of the containing portions 81 of the test tray 80 or that of the holding regions 422 of the thermal head 42. In a case where the pitch of the containing portions 81 is different from that of the holding regions 422, the first movable head 32 may include a pitch changing mechanism for changing the pitch of the first suction heads 321.

The second movable head 33 also includes four second suction heads 331, and second suction nozzles 332 are attached to the lower ends of the respective second suction heads 33. The second suction head 331 is able to suction and hold the bare die 90 by using the second suction nozzle 332, so that the second movable head 33 is able to simultaneously hold the four bare dies 90. Each of the second suction heads 331 includes a second Z-driving unit 333 for lifting up and down the second suction nozzle 332.

The four second suction heads 331 are held by a second base portion 334. The four second suction heads 331 are held by the second base portion 334 with a pitch equal to that of the containing portions 81 of the test tray 80 or that of the holding regions 422 of the thermal head 42. In a case where the pitch of the containing portions 81 is different from that of the holding regions 422, the second movable head 33 may include a pitch changing mechanism for changing the pitch of the second suction heads 331.

In the embodiment, the first movable head 32 transfers the untested bare dies 90 from the tray 80 to the alignment unit 40. On the other hand, the second movable head 33 transfers the tested bare dies 90 from the alignment unit 40 to the tray 80. The transfer device 30 is connected to the control device 70 which is described later with reference to FIG. 6. The number and arrangement of the first suction heads 321 included in the first movable head 32 are not particularly limited to the aforementioned number and arrangement, the number and arrangement of the first suction heads 321 included in the first movable head 32 are set according to the number of simultaneous measurements or the like of the electronic device testing apparatus 1. Similarly, the number and arrangement of the second suction heads 331 included in the second movable head 33 are not particularly limited to the aforementioned number and arrangement, the number and arrangement of the second suction heads 331 included in the second movable head 33 are set according to the number of simultaneous measurements of the electronic device testing apparatus 1.

The alignment unit 40 includes a moving device 41, a thermal head 42, and a lift unit 43. The alignment unit 40 is a unit for performing positioning of the bare dies 90 transferred by the transfer device 30 relative to the probe card 11 and, after that, pressing the bare dies 90 against the probe card 11. Similarly to the transfer device 30, the alignment unit 40 is connected to a control device 70 which is described later with reference to FIG. 6.

The moving device 41 in the embodiment corresponds to an example of the first moving device in the present invention; the thermal head 42 in the embodiment corresponds to an example of the holding member in the present invention; and the lift unit 43 in the embodiment corresponds to an example of the position adjusting member in the present invention.

The moving device 41 includes an X directional rail 411, a Y directional rail 412, and a Z-driving unit 413. The X directional rail 411 is provided on the lower base 22 of the handler 20 so as to extend in the X direction. The Y directional rail 412 is slidably held by the X directional rail 411 so as to move along the X direction. The Z-driving unit 413 is slidably held by the Y directional rail 412 so as to move along the Y direction. A thermal head 42 is attached to the Z-driving unit 413. The Z-driving unit 413 is able to lift up and down the thermal head 42 and to rotate the thermal head 42 about the Z axis. As a result, the thermal head 42 is able to be moved in the X, Y, and Z directions and to rotate about the Z axis by using the moving device 41.

As illustrated in FIGS. 3 and 4, the thermal head 42 includes a holding surface 421 for holding the bare dies 90 and a receiving space 423 for receiving blocks 431 of the lift unit 43. The receiving space 423 has a window portion 424 which is open in the three directions, that is, the +X, −Y, and −X directions and is closed only in the +Y direction by a sidewall 425. In a case where a layout where the fixed arm 50 does not interfere with sidewalls 425a to 425c of the thermal head 42 can be employed, as illustrated in FIG. 5, the window portion 424 of the receiving space 423 may be open only in one direction, that is, the −Y direction.

In the embodiment, as indicated by a dashed-dotted line in FIG. 3, the four holding regions 422 are provided on the holding surface 421. It is possible to hold the bare dies 90 in the respective holding regions 422, so that the thermal head 42 is able to simultaneously hold the four bare dies 90. The number and arrangement of the holding regions 422 are not particularly limited to the aforementioned number and arrangement, the number and arrangement of the holding regions 422 are set according to the number of simultaneous measurements or the like of the electronic device testing apparatus 1.

Four openings 427 are formed in each holding region 422. The openings 427 communicate with the receiving space 423 through through-holes 426 which extend along the vertical direction (±Z directions). A pair of holding holes 428 which extend upwards from the receiving space 423 are formed outward relative to the four through-holes 426. Each of the holding holes 428 has a diameter-enlarged portion 429 of which inner diameter is enlarged at the upper portion thereof.

The number and arrangement of the through-holes 426 are not particularly limited to the aforementioned number and arrangement, the number and arrangement of the through-holes 426 are set according to the number and arrangement of lift pins 432 of the lift unit 43 described later. Similarly, the number and arrangement of the holding holes 428 are not particularly limited to the aforementioned number and arrangement, the number and arrangement of the holding holes 428 are set according to the number and arrangement of holding pins 433 of the lift unit 43 described later. The ±Z directions in the embodiment correspond to an example of the first direction in the present invention, and the −Y direction in the embodiment corresponds to an example of the second direction in the present invention.

Although not particularly illustrated, a heating device such as a heater is buried in the thermal head 42. A cooling passage which is connected to a chiller is formed in the thermal head 42. Accordingly, the temperature of the bare dies 90 held by the holding surface 421 of the thermal head 42 can be adjusted.

The lift unit 43 includes a block 431, four lift pins 432, and two holding pins 433. The four lift pins 432 are standingly provided on the block 431 so as to correspond to the through-holes 426 of the thermal head 42. The two holding pins 433 are standingly provided on the block 431 so as to correspond to the holding holes 428 of the thermal head 42. The holding pin 433 has a head portion 434 of which outer diameter is enlarged at the distal end thereof. The lift pin 432 in the embodiment corresponds to an example of the pin in the present invention.

The outer diameter of the lift pin 432 is relatively smaller than the inner diameter of the through-hole 426 of the thermal head 42, so the lift pin 432 is inserted into the through-hole 426. The blocks 431 are arranged inside the receiving space 423 of the thermal head 42.

The inner diameter of the holding pin 433 is also relatively smaller than the inner diameter of the holding hole 428 of the thermal head 42, so that the holding pin 433 is inserted into the holding hole 428. On the other hand, the head portion 434 of the holding pin 433 has an outer diameter which is relatively larger than the inner diameter of the holding hole 428 and is relatively smaller than the diameter-enlarged portion 429 of the holding hole 428, so that the head portion 434 is engaged with the step difference of the diameter-enlarged portion 429.

For this reason, the lift unit 43 is able to be moved in the horizontal direction relative to the thermal head 42 and lifted up and down relative to the thermal head 42. That is, the lift unit 43 is movably held by the thermal head 42, and the distal ends of the lift pins 432 are able to advance and retreat through the openings 427 of the thermal head 42.

As long as the lift unit 43 is able to stably hold the bare dies 90, the number and arrangement of the lift pins 432 are not particularly limited to the aforementioned number and arrangement. As long as the lift unit 43 is stably held by the thermal head 42, the number and arrangement of the holding pins 433 are not particularly limited to the aforementioned number and arrangement.

The fixed arm 50 is a member for supporting the lift unit 43 from the lower side and includes a first arm portion 51 and a second arm portion 52 (refer to FIG. 10 or the like). The fixed arm 50 in the embodiment corresponds to an example of the supporting member in the present invention.

The first arm portion 51 is standingly provided on the lower base 22 of the handler 20 so as to extend upwards. In the embodiment, the first arm portion 51 of the fixed arm 50 and the X directional rail 411 of the alignment unit 40 are fixed to the same member (that is, the lower base 22). The lower base 22 in the embodiment corresponds to an example of the base member in the present invention.

In the embodiment, the first arm portion 51 is provided on the lower base 22 so as to be positioned outside the X directional rail 411 of the alignment unit 40. However, the present invention is not particularly limited thereto, the first arm portion 51 may be provided between a pair of the X directional rails 411. In this case, the fixed arm 50 is able to be lifted up and down by an actuator, and only in a case where the positioning of the bare dies 90 is performed by using the fixed arm 50, the fixed arm 50 is lifted up. In this state, the fixed arm 50 is fixed relative to the lower base 22 through the actuator.

The second arm portion 52 is supported by the first arm portion 51 at the one end thereof in a cantilever manner and has a contact portion 521 at the other end thereof. The second arm portion 52 extends in the +Y direction and enters the receiving space 423 through the window portion 424 of the thermal head 42 according to the horizontal moving operation of the thermal head 42. Next, according to the lifting-down operation of the thermal head 42 by the moving device 41, the contact portion 521 of the second arm portion 52 comes into contact with the block 431, so that the fixed arm 50 supports the lift unit 43. In this state, the moving device 41 moves the thermal head 42 in the X or Y direction or rotates the thermal head 42 about the Z direction so that the lift unit 43 is able to be moved relative to the thermal head 42. The +Y direction in the embodiment corresponds to an example of the third direction in the present invention.

As illustrated in FIGS. 1 and 2, the handler 20 includes a first camera 60 and a second camera 65 in order to perform positioning of the bare dies 90 relative to the probe card 11 by the alignment unit 40.

The first camera 60 is an imaging unit which captures an image of the probe card 11 and is provided on the alignment unit 40. On the other hand, the second camera 65 is an imaging unit which captures an image of the bare dies 90 held by the thermal head 42 and is provided on the upper base 21 of the handler 20. As illustrated in FIG. 6, the first and second cameras 60 and 65 are connected to the control device 70, so that it is possible to output the captured image information to the control device 70. In the embodiment, as illustrated in FIGS. 1 and 2, the second camera 70 is provided just above the contact portion 521 of the fixed arm 50. However, the present invention is not particularly limited thereto.

The control device 70 is a computer which includes a CPU, a main memory device (RAM or the like), an auxiliary storage device (hard disk, SSD, or the like), an interface, and the like and functionally includes an image processing unit 71 which performs an image process on image information. The image processing unit 71 detects the positions and postures of the contactors 12 of the probe card 11 by performing the image process on the image information output from the first camera 60. In addition, the image processing unit 71 detects the positions and postures of the pads 91 of the bare dies 90 by performing the image process on the image information output from the second camera 65.

In addition, the control device 70 functionally includes a calculation unit 72 which calculate a correction amount of the position of the bare die 90 with respect to the position of the probe card 11 on the basis of a detection result of the image processing unit 71. The calculation unit 72 calculates the correction amount so as to relatively match the positions of the contactors 12 of the probe card 11 and the pads 91 of the bare dies 90 from the detection result of the image processing unit 71.

In addition, the control device 70 includes a driving control unit 73 for controlling the transfer device 30 and the alignment unit 40. The driving control unit 73 performs relative positioning of the bare dies 90 with respect to the probe card 11 by driving the alignment unit 40 on the basis of the correction amount.

The first camera 60, the second camera 65, the image processing unit 71, and the calculation unit 72 in the embodiment correspond to an example of the position detection unit in the present invention, and the driving control unit 73 in the embodiment corresponds to an example of the control unit in the present invention.

Hereinafter, operations of the electronic device testing apparatus in the embodiment will be described with reference to FIGS. 7 to 17. FIGS. 7 to 17 are cross-sectional diagrams illustrating the operations of the electronic device testing apparatus in the embodiment.

Figure 7:
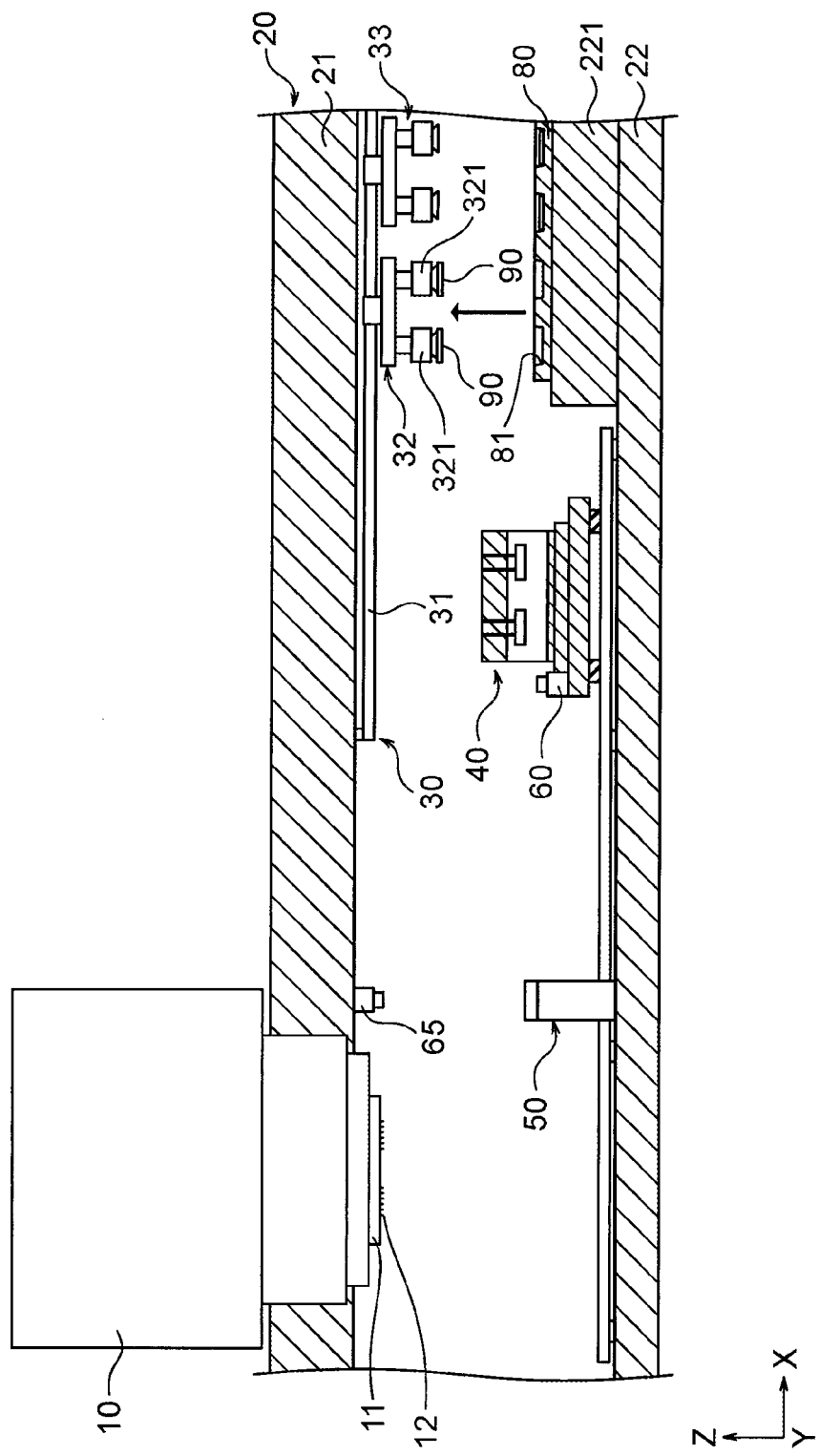
FIG. 7 is a cross-sectional diagram (No. 1) illustrating operations of the electronic device testing apparatus in the first embodiment of the present invention.

First, as illustrated in FIG. 7, the first movable head 32 of the transfer device 30 moves above the bare dies 90 contained in the tray 80, and the first Z-driving unit 323 moves downward, so that the bare dies 90 are suctioned and held from the tray 80 by the first suction heads 321. At this time, the first movable head 32 holds the four bare dies 90 by using the four first suction heads 321. When the first suction heads 321 hold the bare dies 90, the first Z-driving unit 323 moves upward.

Figure 8:
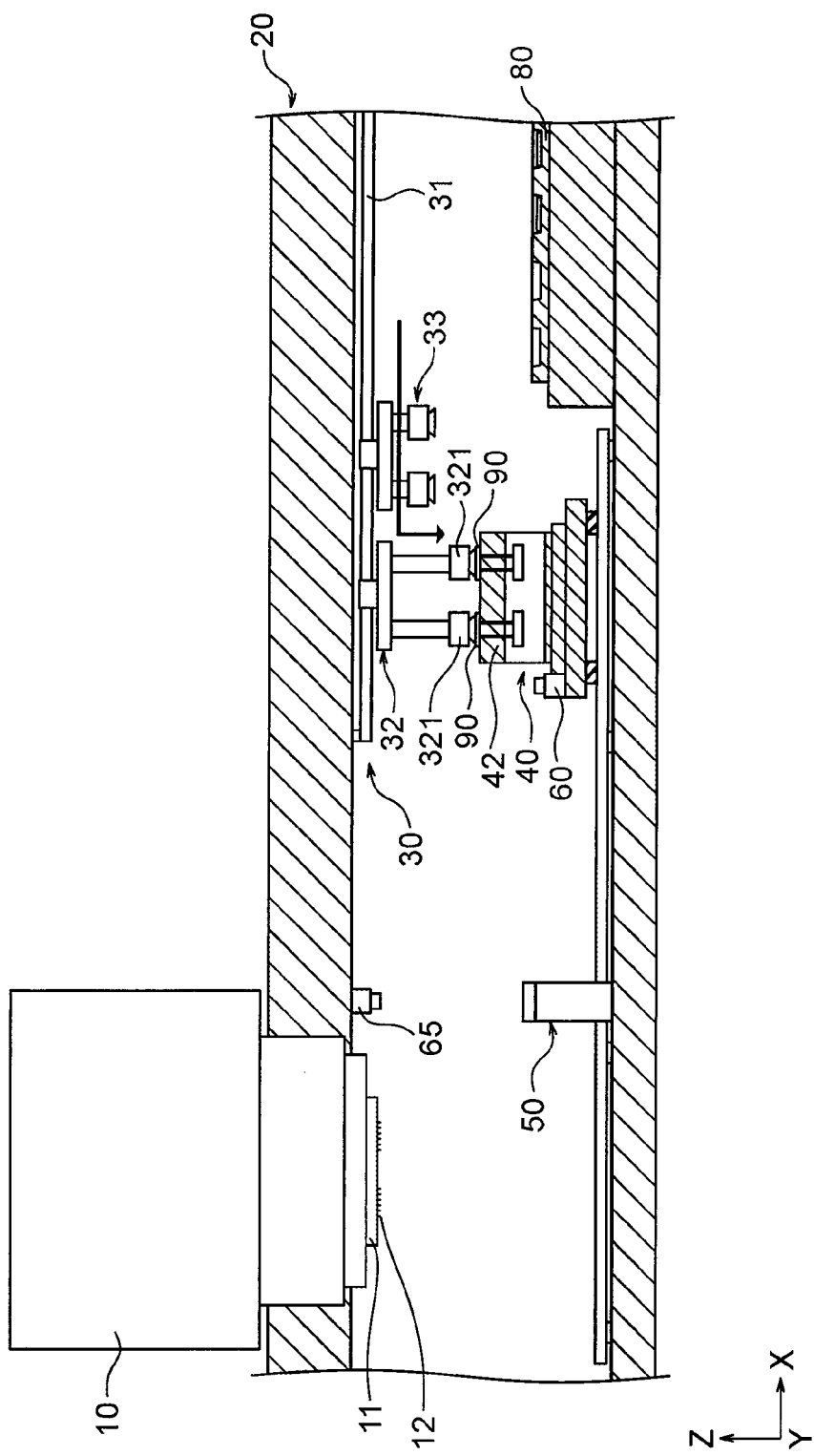
FIG. 8 is a cross-sectional diagram (No. 2) illustrating operations of the electronic device testing apparatus in the first embodiment of the present invention.

Next, as illustrated in FIG. 8, the first movable head 32 of the transfer device 30 moves above the thermal head 42 of the alignment unit 40, and the first Z-driving unit 323 moves downward, so that the bare dies 90 are placed on the holding surface 421 of the thermal head 42. At this time, the first movable head 32 places the four bare dies 90 on the respective holding regions 422 of the retaining surface 421.

Figure 9:
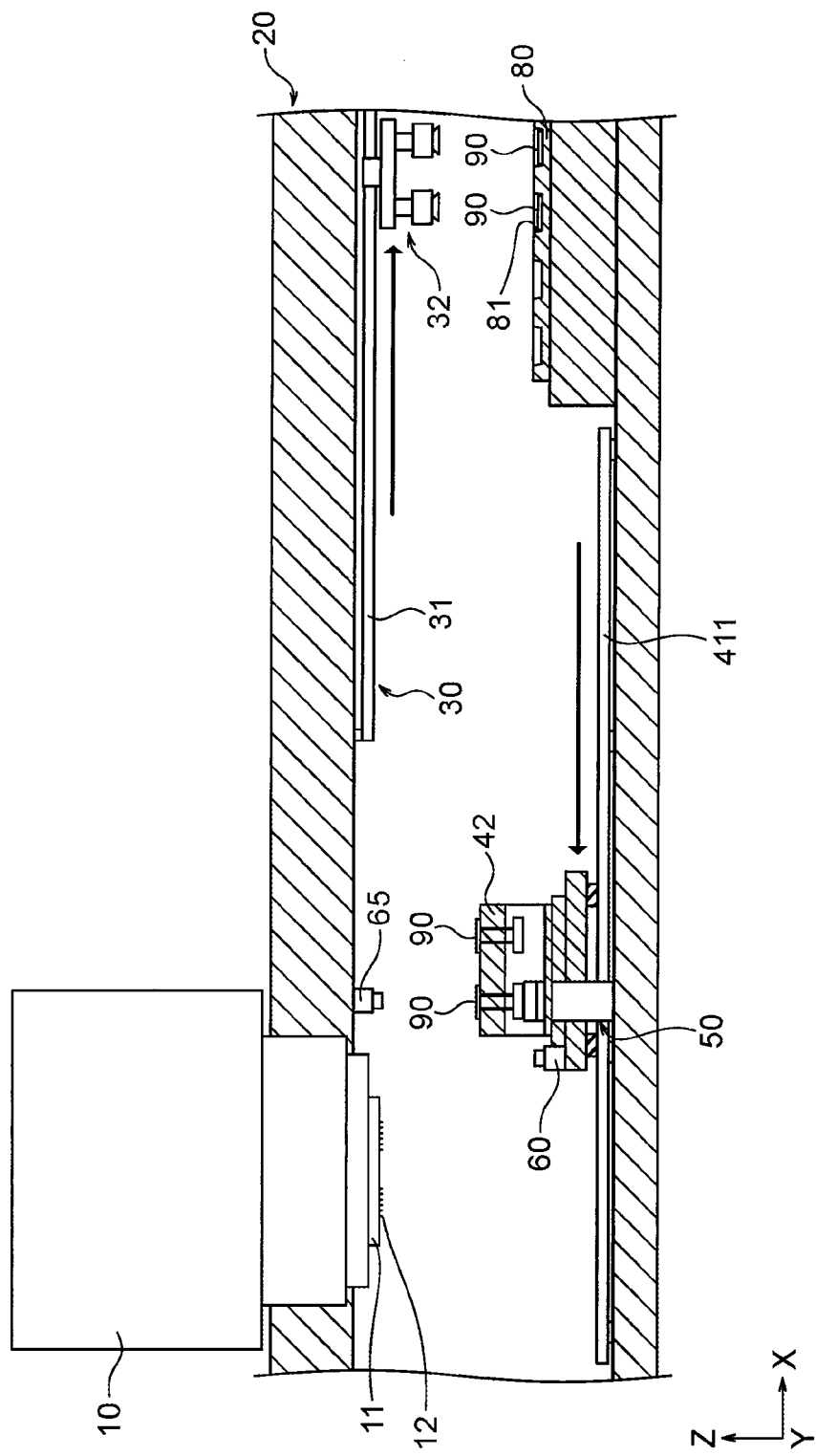
FIG. 9 is a cross-sectional diagram (No. 3) illustrating operations of the electronic device testing apparatus in the first embodiment of the present invention.

Next, as illustrated in FIG. 9, the alignment unit 40 moves the thermal head 42 holding the four bare dies 90 in the −X direction so as to position the bare dies 90 below the second camera 65. As illustrated in FIG. 10, by this operation, the contact portion 521 of the fixed arm 50 is positioned below the block 431 of the lift unit 43.

Next, as illustrated in FIG. 10, the second camera 65 images the bare dies 90, so that the image processing unit 71 of the control device 70 detects the positions of the pads 91 of the bare dies 90. The positions of the contactors 12 of the probe card 11 are detected in advance by using the first camera 60 at the time of lot start or at the time of replacing the probe card 11. The calculation unit 72 of the control device 70 calculates the correction amount from the result of detection.

Figure 11:
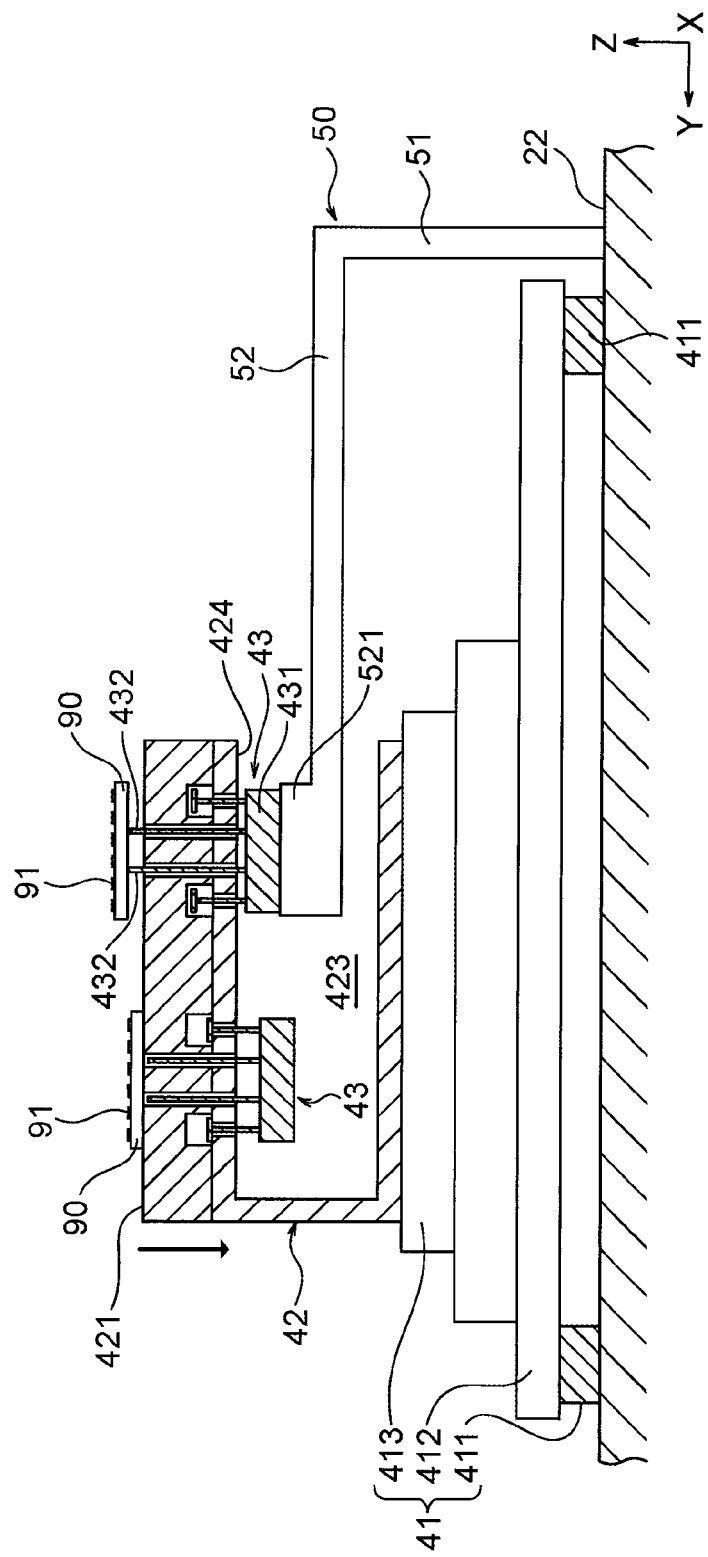
FIG. 11 is a cross-sectional diagram (No. 5) illustrating operations of the electronic device testing apparatus in the first embodiment of the present invention.

Next, as illustrated in FIG. 11, the control device 70 controls the moving device 41 so as to lift down the thermal head 42. Since the fixed arm 50 is lifted up relative to the thermal head 42 according to this lift-down operation, the contact portion 521 of the fixed arm 50 comes into contact with the block 431 from the lower side, and the fixed arm 50 supports one lift unit 43. In addition, by the lift-down operation, the lift pins 432 of the lift unit 43 protrude from the holding surface 421 of the thermal head 42 through the openings 427 so as to hold the bare dies 90.

Figure 12:
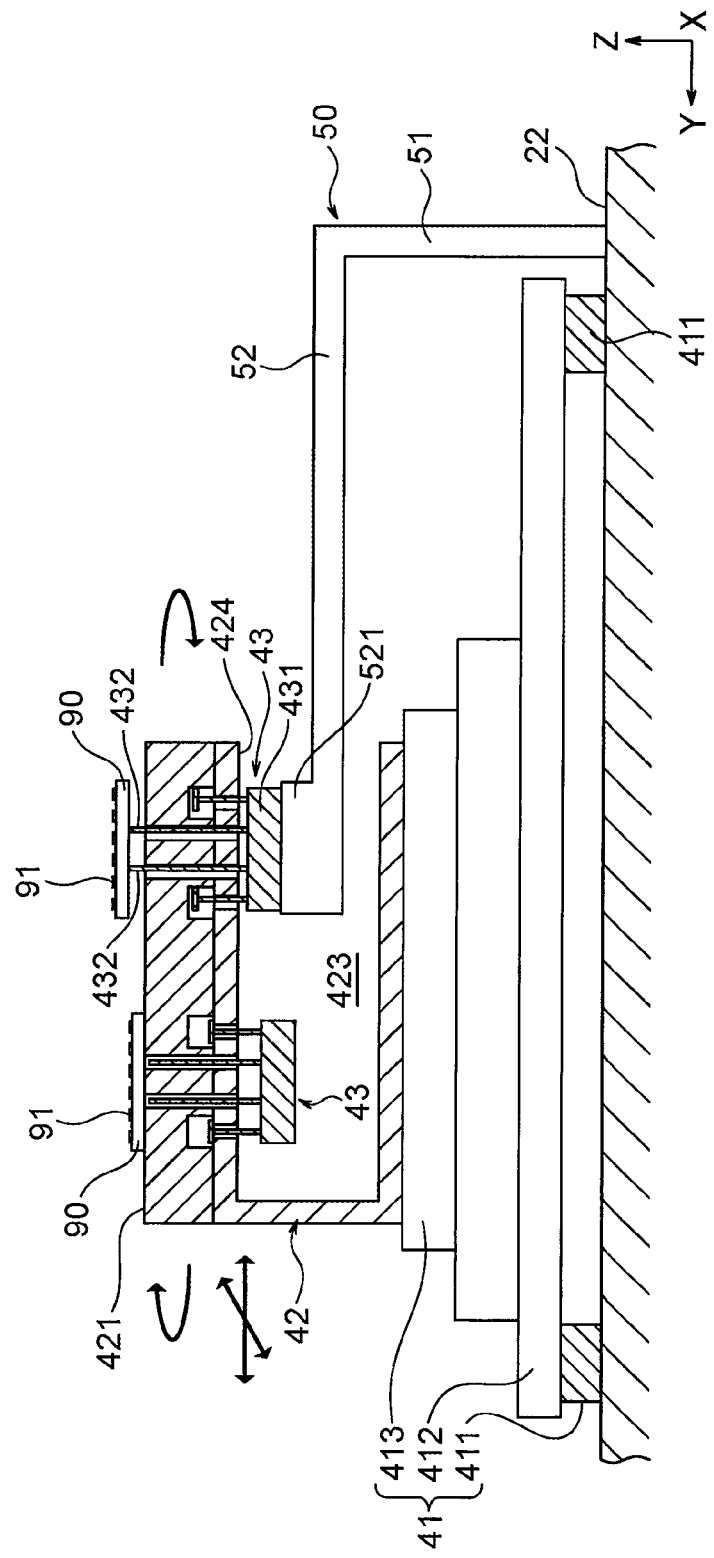
FIG. 12 is a cross-sectional diagram (No. 6) illustrating operations of the electronic device testing apparatus in the first embodiment of the present invention.

Next, as illustrated in FIG. 12, in the state where the fixed arm 50 supports the lift unit 43 (namely, in the state where the lift pins 432 hold the bare dies 90), the control device 70 drives the moving device 41 on the basis of the above-described correction amount so as to move the thermal head 42 in the X and Y directions or to rotate the thermal head 42 around the Z direction. By this moving operation, the positioning of the bare dies 90 relative to the probe card 11 is performed.

Figure 13:
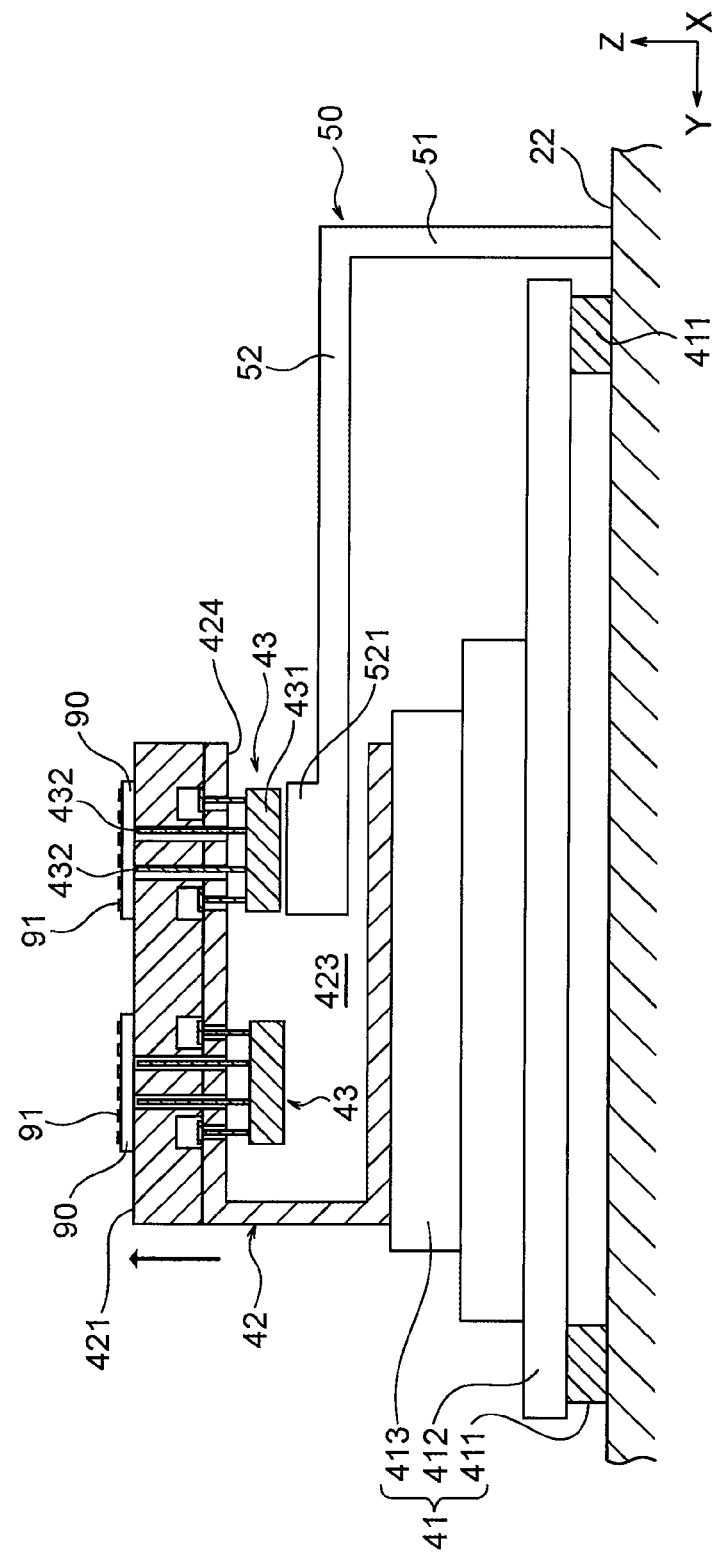
FIG. 13 is a cross-sectional diagram (No. 7) illustrating operations of the electronic device testing apparatus in the first embodiment of the present invention.

When the positioning of the bare dies 90 is completed, as illustrated in FIG. 13, the control device 70 controls the moving device 41 so as to lift up the thermal head 42. Since the fixed arm 50 is lifted down relative to the thermal head 42 according to this lift-up operation, the lift pins 432 retreats into the through-holes 426 of the thermal head 42, so that the holding of the bare dies 90 by the lift pins 432 is released, and the bare dies 90 are held by the holding surface 421 of the thermal head 42. In addition, by the lift-up operation, the supporting of the lift unit 43 by the fixed arm 50 is released, so that the lift unit 43 is held by the thermal head 42.

Figure 14:
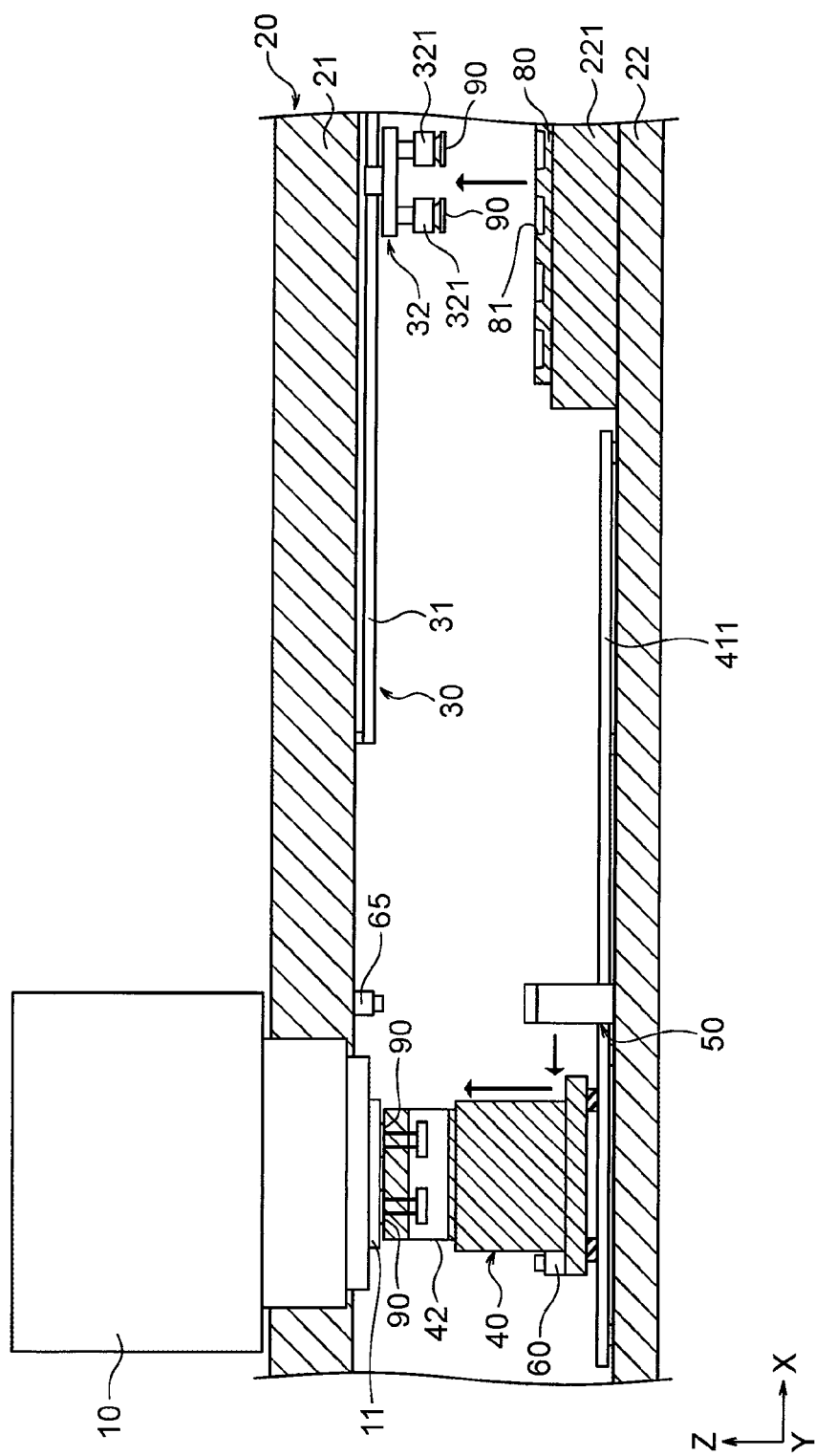
FIG. 14 is a cross-sectional diagram (No. 8) illustrating operations of the electronic device testing apparatus in the first embodiment of the present invention.

After the above-described positioning operation is individually performed on the four bare dies 90, as illustrated in FIG. 14, the alignment unit 40 further moves in the −X direction so as to position the bare dies 90 below the probe card 11. Next, the alignment unit 40 lifts up the thermal head 42 to press the pads 91 of the bare dies 90 against the contactors 12 of the probe card 11, so that the pads and the contactors are in electrical contact with each other. In this state, the test head 10 and the main frame 15 performs the test of electric circuits formed in the bare dies 90.

As illustrated in FIG. 9 or 14, while the alignment unit 40 performs the positioning of the bare dies 90, the transfer device 30 performs the operation of holding the next-test-object bare dies 90 from the tray 80 by using the first movable head 32.

Figure 15:
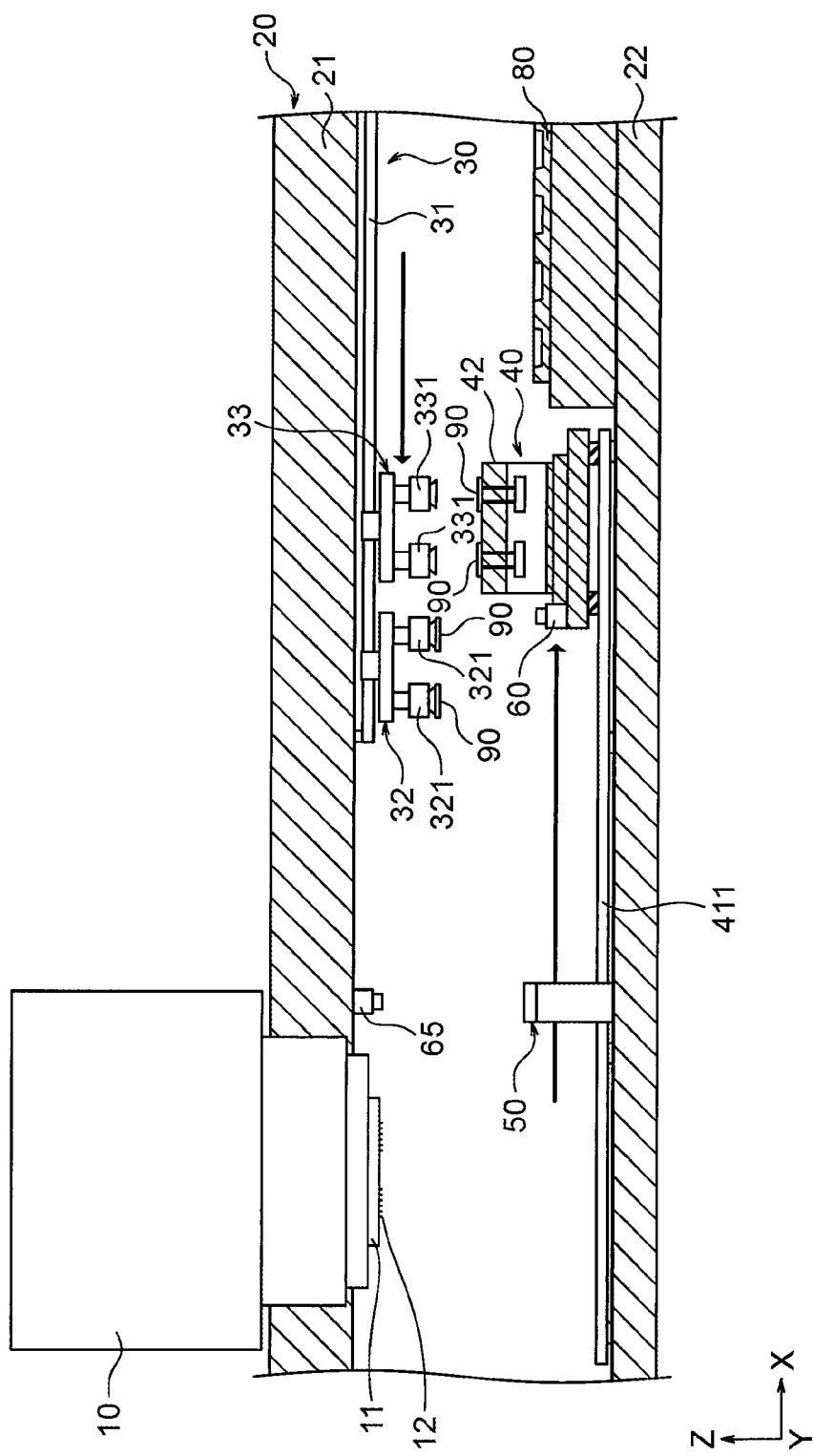
FIG. 15 is a cross-sectional diagram (No. 9) illustrating operations of the electronic device testing apparatus in the first embodiment of the present invention.
Figure 16:
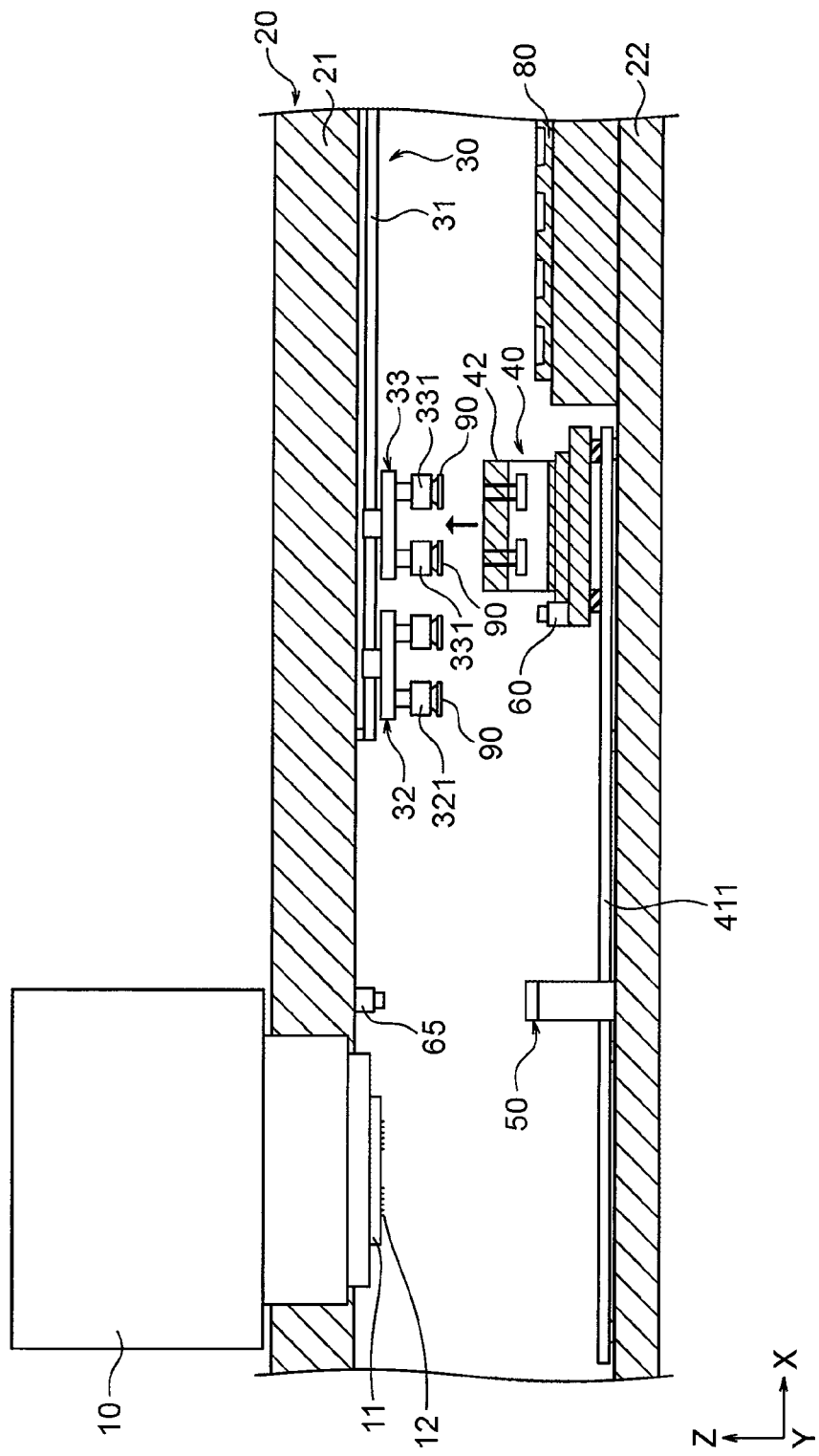
FIG. 16 is a cross-sectional diagram (No. 10) illustrating operations of the electronic device testing apparatus in the first embodiment of the present invention.

When the test of the bare dies 90 is completed, as illustrated in FIG. 15, the alignment unit 40 moves the bare dies 90 to the positions near the tray 80, and the second movable head 43 of the transfer device 30 moves above the bare dies 90. Next, as illustrated in FIG. 16, the second movable head 33 lifts down the second Z-driving unit 333 to hold the four tested bare dies 90 by using the four second suction heads 331. When the second suction head 331 holds the tested bare dies 90, the second Z-driving unit 333 moves upward.

Figure 17:
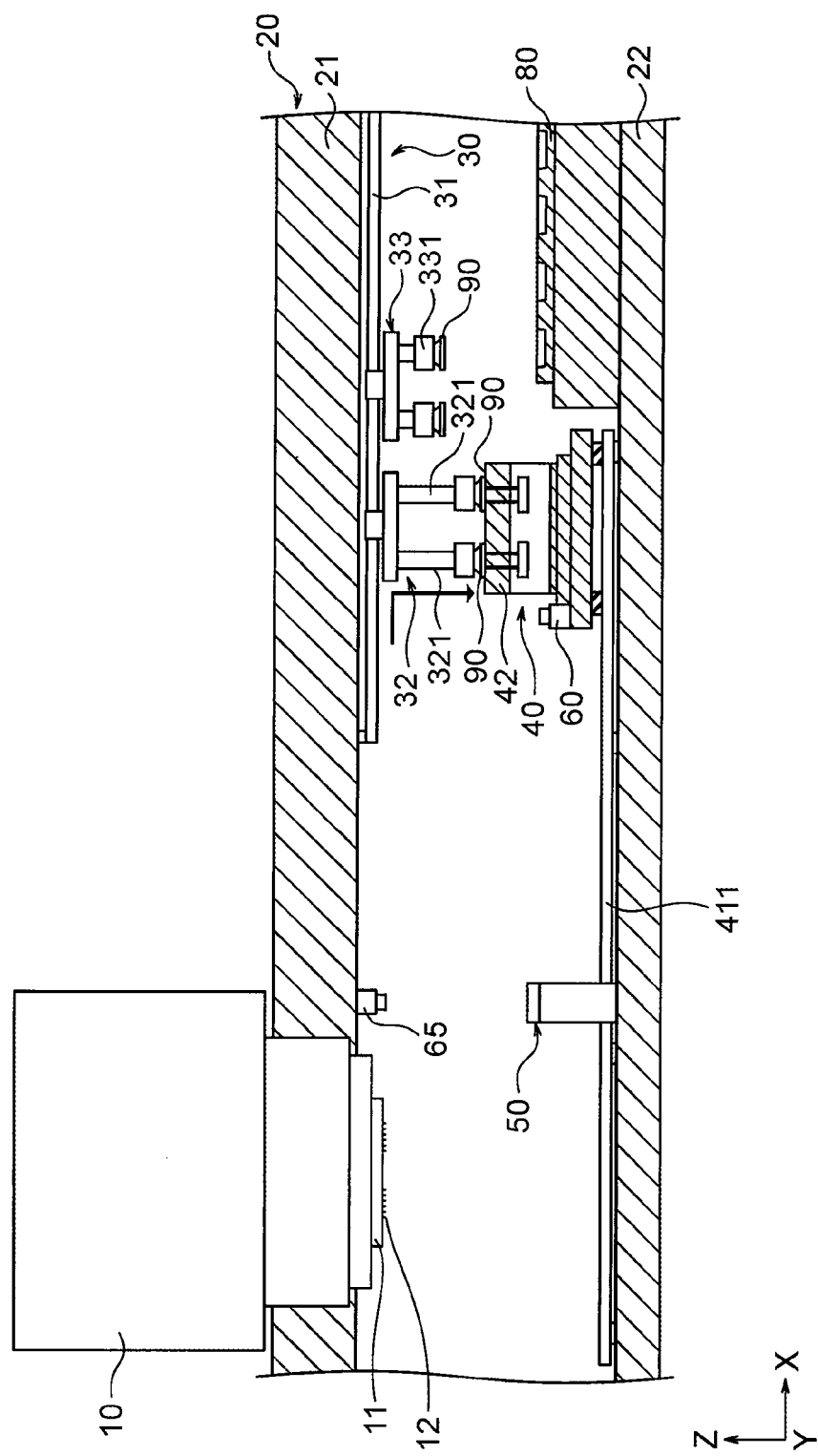
FIG. 17 is a cross-sectional diagram (No. 11) illustrating operations of the electronic device testing apparatus in the first embodiment of the present invention.

Next, as illustrated FIG. 17, the first movable head 32 of the transfer device 30 moves above the thermal head 42 of the alignment unit 40 and the first Z-driving unit 323 moves downward, so that the bare dies 90 are placed on the holding surface 421 of the thermal head 42. The above-described operations are repeated, so that a plurality of the bare dies 90 are sequentially tested. On the other hand, although not particularly illustrated, the second movable head 33 places the tested bare dies 90 in the containing portions 81 of the tray 80, and the tray 80 is unloaded from the handler 20.

As described above, in the embodiment, in the state where the lift unit 43 which is movably held by the thermal head 42 is supported by the fixed arm 50, the fixed arm 50 is moved relative to the thermal head 42 by using the moving device 41, so that it is possible to individually perform the positioning of the bare dies 90. Therefore, there is no need to provide an actuator for positioning to each lift unit 43, and it is possible to increase the number of simultaneous measurements while suppressing the increase in cost.

In addition, in the embodiment, since the fixed arm 50 is moved relative to the thermal head 42 by using the moving device 41 of the alignment unit 40, it is possible to further decrease the number of actuators, so that it is possible to reduce the cost. In addition, since the error factor related to the positioning of the bare dies 90 is only the fixed arm 50, it is possible to perform the positioning of the bare dies 90 relative to the probe card 11 with high accuracy.

<Second Embodiment>

Figure 18:
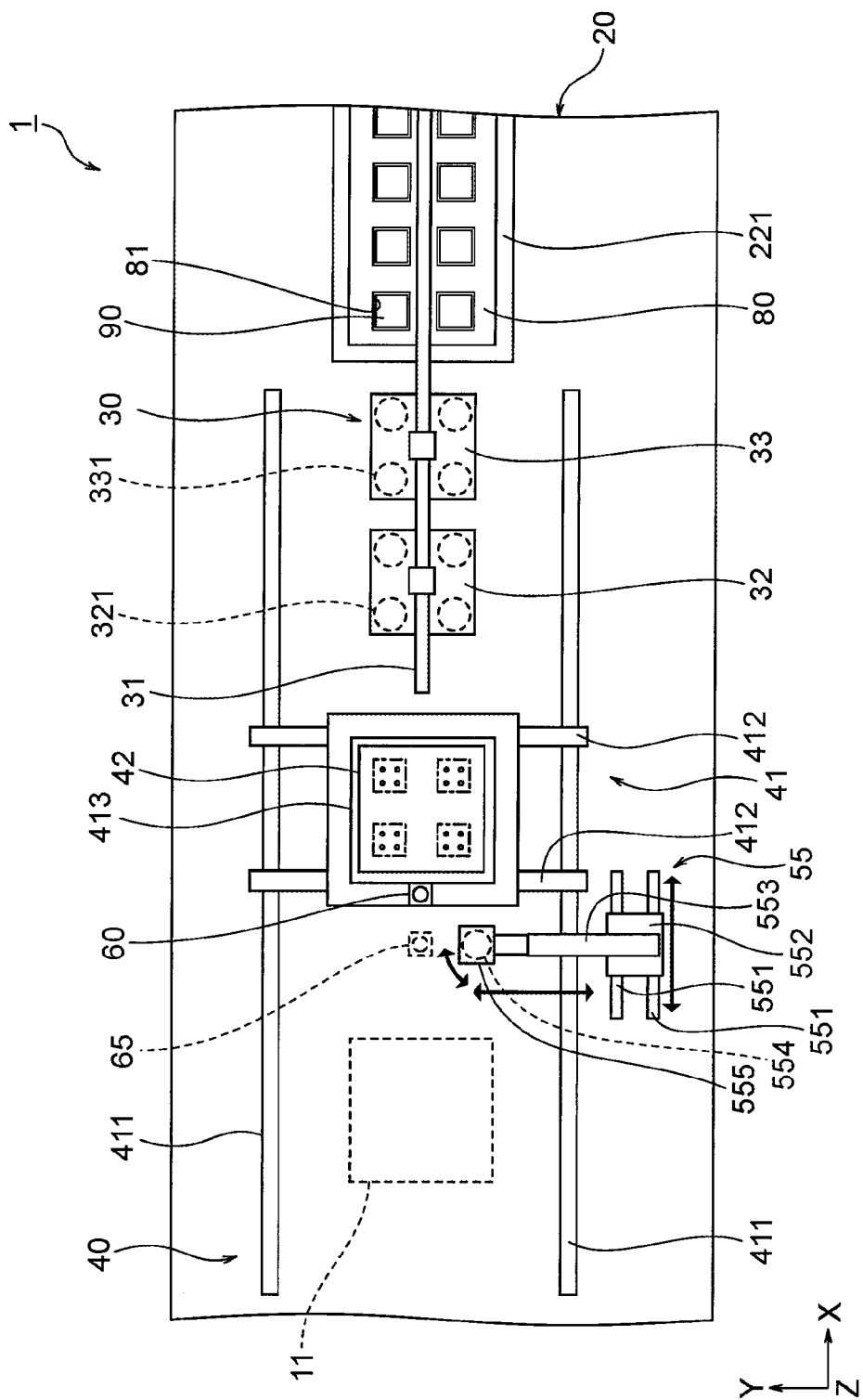
FIG. 18 is a plan diagram illustrating an internal structure of an electronic device testing apparatus in a second embodiment of the present invention.
Figure 19:
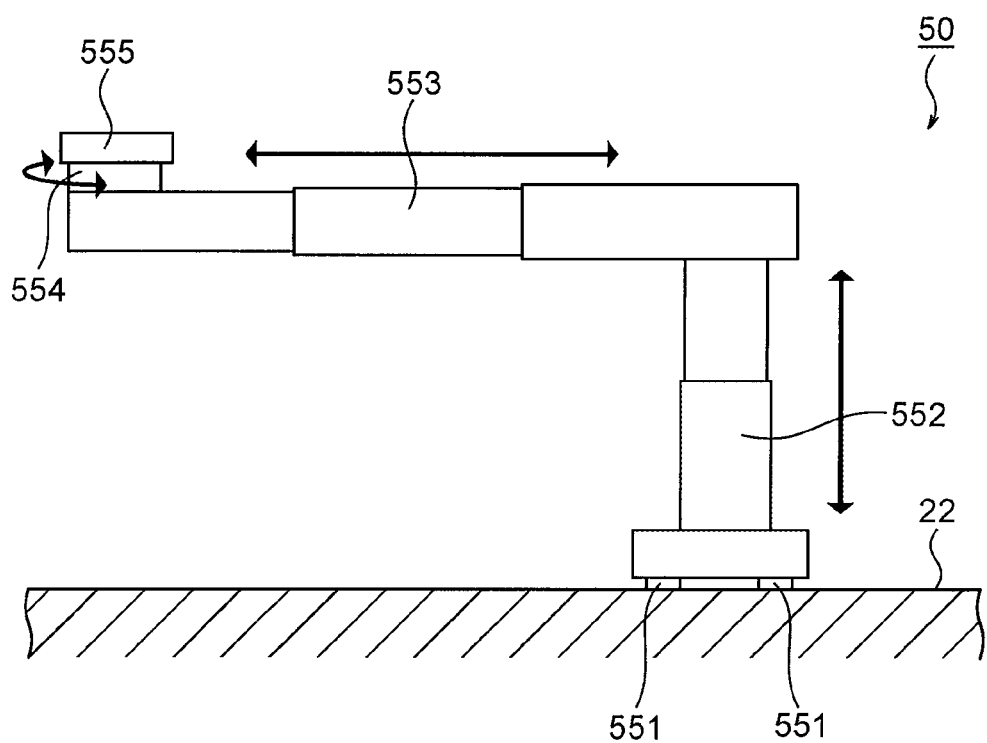
FIG. 19 is a side diagram illustrating a manipulation device in the second embodiment of the present invention.

FIG. 18 is a plan diagram illustrating an internal structure of an electronic device testing apparatus in a second embodiment of the present invention, and FIG. 19 is a side diagram illustrating a manipulation device in the second embodiment of the present invention.

The embodiment is different from the first embodiment in that the embodiment includes a manipulation device 55 instead of the fixed arm 50, but the other configurations are the same as those of the first embodiment. Hereinafter, the difference between the electronic device testing apparatus of the second embodiment and that of the first embodiment will be described. The same components as those of the first embodiment will be denoted by the same reference numerals, and the description thereof will be omitted.

As illustrated in FIGS. 18 and 19, the manipulation device 55 in the embodiment is a device which moves a lift unit 43 relative to a thermal head 42 by directly manipulating the lift unit 43. The manipulation device includes an X directional rail 551, a Z-driving unit 552, an expansible arm 553, a rotation driving unit 554, and a contact portion 555. The manipulation device 55 in the embodiment corresponds to an example of the supporting member and the second moving device in the present invention.

The X directional rail 551 is provided on a lower base 22 of a handler 20 so as to extend in the X direction. The Z-driving unit 552 is slidably held by the X directional rail 551 so as to be movable along the X direction. The expansible arm 553 is attached to the Z-driving unit 552. The Z-driving unit 552 is able to lift up and down the expansible arm 553. The expansible arm 553 is configured to be expansible in the Y direction, and the rotation driving unit 554 is attached to the distal end of the expansible arm 553. The contact portion 555 which comes into contact with the block 431 of the lift unit 43 from the lower side is attached to the rotation driving unit 554. The rotation driving unit 554 is able to rotate the contact portion 555 about the Z axis. As a result, the contact portion 555 is able to be moved in the X, Y, and Z directions and is able to be rotated about the Z axis by using the X directional rail 551, the Z-driving unit 552, the expansible arm 553, and the rotation driving unit 554.

In the embodiment, by the operations of the X directional rail 551 and the expansible arm 553 or by the operation of the moving device 41, the contact portion 555 enters the receiving space 423 of the thermal head 42 so as to be positioned below the block 431 of the lift unit 43. Next, by the operation of the Z-driving unit 552, the contact portion 555 is lifted up and comes into contact with the block 431 from the lower side so as to support the lift unit 43. The lift pins 432 of the lift unit 43 protrude from the holding surface 421 of the thermal head 42 through the openings 427 so as to hold the bare dies 90. Next, by driving the X directional rail 551, the expansible arm 553, and the rotation driving unit 554, the positioning of the bare dies 90 relative to the probe card 11 is performed.

In the embodiment, the moving device 41 may lift down the thermal head 42 so that the contact portion 555 comes into contact with the lift unit 43. The moving device 41 may move the thermal head 42 in the X and Y direction or rotate the thermal head 42 about the Z direction in the state where the manipulation device 55 supports the lift unit 43 so that the positioning of the bare dies 90 is performed.

In the embodiment, in the state where the lift unit 43 which is movably held by the thermal bead 42 is supported by the manipulation device 55, the lift unit 43 is moved by using the manipulation device 55, so that it is possible to individually perform the positioning of the bare dies 90. Therefore, there is no need to provide an actuator for positioning to each lift unit 43, and it is possible to increase the number of simultaneous measurements while suppressing the increase in cost.

The above-described embodiments are described in order to facilitate the understanding of the present invention, but the embodiments are not described in order to limit the present invention. Therefore, it is intended that each element disclosed in the above-described embodiments includes all design modifications and equivalents belonging to the technical scope of the present invention.

In the above-described embodiment, although the lift units 43 are provided to all the holding regions 422 of the thermal head 42, the present invention is not particularly limited thereto.

For example, the lift units 43 may be provided to three holding regions 422, and the lift unit 43 may not be provided to the remaining one of the holding regions 422. In this case, in the three holding regions 422 to which the lift units 43 are allocated, the positioning of the bare dies 90 is performed by using the fixed arm 50. On the other hand, in the one holding regions 422 to which the lift unit 43 is not allocated, the positioning may be performed by the alignment unit 40 in the state where the bare dies 90 are held by the holding surface 421.

In the above-described embodiment, although the bare dies are exemplified as the test objects, the present invention is not particularly limited thereto. For example, the present invention may be applied to an apparatus where packaged IC devices are test objects.

In this case, the packaged IC device corresponds to an example of the electronic device under test in the present invention, and the socket which the IC device is pressed against corresponds to an example of the contact unit in the present invention.

EXPLANATIONS OF LETTERS OR NUMERALS

1 : Electronic device testing apparatus
10: Test head
11: Probe card
12: Contactor
15: Main frame
20: Handler
21: Upper base
211: Opening
22: Lower base
221: Tray mount unit
30: Transfer device
31: X directional rail
32: First movable head
321: First suction head 322: First suction nozzle
323: First Z-driving unit
324: First base portion
33: Second movable head
331: Second suction head
332: Second suction nozzle
333: Second Z-driving unit
334: Second base portion
40: Alignment unit
41: Moving device
411: X directional rail
412: Y directional rail
413: Z-driving unit
42: Thermal head
421: Holding surface
422: Holding region
423: Receiving space
424: Window portion
425, 425a~425c: Sidewall
426: Through-hole
427: Opening
428: Holding hole
429: Diameter-enlarged portion
43: Lift unit
431: Block
432: Lift pin
433: Holding pin
434: Head portion
50: Fixed arm
51: First arm portion
52: Second arm portion
521: Contact portion
55: Manipulation device
551: X directional rail
552: Z-driving unit
553: Expansible arm
554: Rotation driving unit
555: Contact portion
60: First camera
65: Second camera
70: Control device
71: Image processing unit
72: Calculation unit
73: Driving control unit
80: Tray
81: Containing portions
90: Bare die
91: Pad

The invention claimed is:

1. An electronic device handling apparatus which moves electronic devices under test relative to a contact unit, comprising:
a holding member which includes at least one holding region which holds the electronic device under test, the at least one holding region having at least one opening;
at least one position adjusting member which is movably held by the holding member so as to correspond to the holding region;
a first moving unit which moves the holding member; and
a supporting member which is able to support the at least one one position adjusting member, wherein:
the holding member includes:
a storage space in which the at least one position adjusting member is stored; and
at least one through-hole through which the opening and the storage space communicate with each other,
the storage space includes a window portion through which the supporting member is able to enter the storage space to support the at least one position adjusting member,
the at least one position adjusting member includes:
at least one pin which includes an end portion which is able to advance and retreat through the opening,
a block on which the pin is standingly provided,
the pin is inserted into the through-hole; and
the block is stored in the storage space,
when the supporting member supports the at least one position adjusting member, the end portion of the at least one position adjusting member protrudes to an outside of the holding member through the opening, and
when the supporting member is separate from the at least one position adjusting member, the end portion of the at least one position adjusting member retracts to an inside of the holding member through the opening.

2. The electronic device handling apparatus according to claim 1, wherein
the first moving unit and the supporting member are fixed relative to a same base member, and
the supporting member includes:
a first arm portion which is standingly provided on the base member; and
a second arm portion which is supported by the first arm portion and is able to enter the storage space through the window portion to support the block.

3. The electronic device handling apparatus according to claim 2, wherein
the through-hole extends in a first direction,
the window portion is open from the storage space toward a second direction which is substantially perpendicular to the first direction, and
the second arm portion extends in a third direction which is substantially opposite to the second direction.

4. An electronic device handling apparatus which moves electronic devices under test relative to a contact unit, comprising:
a holding member which includes at least one holding region which holds the electronic device under test, the at least one holding region having at least one opening;
at least one position adjusting member which is movably held by the holding member so as to correspond to the holding region;
a first moving unit which moves the holding member; and
a supporting member which is able to support the at least one one position adjusting member, wherein:
the holding member includes:
a storage space in which the at least one position adjusting member is stored, and
at least one through-hole through which the opening and the storage space communicate with each other,
the storage space includes a window portion through which the supporting member is able to enter the storage space to support the at least one position adjusting member,
the at least one position adjusting member includes:
at least one pin which includes an end portion which is able to advance and retreat through the opening,
a block on which the pin is standingly provided,
the pin is inserted into the through-hole, and
the block is stored in the storage space,
when the supporting member supports the at least one position adjusting member, the end portion of the at least one position adjusting member protrudes to an outside of the holding member through the opening, and when the supporting member is separate from the at least one position adjusting member, the end portion of the at least one position adjusting member retracts to an inside of the holding member through the opening.

5. The electronic device handling apparatus according to claim 4, wherein the supporting member is able to enter the storage space through the window portion to support the block.

6. The electronic device handling apparatus according to claim 5, wherein the through-hole extends in a first direction, the window portion is open from the storage space toward a second direction which is substantially perpendicular to the first direction, and the supporting member extends in a third direction which is substantially opposite to the second direction.

* * * * *